(12) United States Patent
Nakajima et al.

(10) Patent No.: US 11,175,583 B2
(45) Date of Patent: Nov. 16, 2021

(54) SILICON-CONTAINING RESIST UNDERLAYER FILM-FORMING COMPOSITION HAVING PHENYL GROUP-CONTAINING CHROMOPHORE

(71) Applicant: NISSAN CHEMICAL INDUSTRIES, LTD., Tokyo (JP)

(72) Inventors: Makoto Nakajima, Toyama (JP); Wataru Shibayama, Toyama (JP); Satoshi Takeda, Toyama (JP); Kenji Takase, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 16/307,056

(22) Filed: Dec. 4, 2018

(65) Prior Publication Data

US 2020/0026191 A1   Jan. 23, 2020

Related U.S. Application Data

(63) Continuation-in-part of application No. 15/319,705, filed as application No. PCT/JP2015/067319 on Jun. 16, 2015, now Pat. No. 10,197,917.

(30) Foreign Application Priority Data

Jun. 17, 2014   (JP) ................................ 2014-124311

(51) Int. Cl.
| | |
|---|---|
| G03F 7/11 | (2006.01) |
| G03F 7/075 | (2006.01) |
| C08G 77/28 | (2006.01) |
| G03F 7/26 | (2006.01) |
| H01L 21/033 | (2006.01) |
| C09D 183/08 | (2006.01) |
| G03F 7/16 | (2006.01) |
| G03F 7/20 | (2006.01) |
| G03F 7/30 | (2006.01) |
| H01L 21/027 | (2006.01) |
| H01L 21/311 | (2006.01) |

(52) U.S. Cl.
CPC ................ *G03F 7/11* (2013.01); *C08G 77/28* (2013.01); *C09D 183/08* (2013.01); *G03F 7/0751* (2013.01); *G03F 7/0752* (2013.01); *G03F 7/0757* (2013.01); *G03F 7/16* (2013.01); *G03F 7/20* (2013.01); *G03F 7/26* (2013.01); *G03F 7/30* (2013.01); *H01L 21/0274* (2013.01); *H01L 21/0332* (2013.01); *H01L 21/31133* (2013.01); *H01L 21/31144* (2013.01)

(58) Field of Classification Search
CPC .... G03F 7/0752; G03F 7/0751; G03F 7/0757; C07F 7/18
See application file for complete search history.

(56) References Cited

U.S. PATENT DOCUMENTS

| | | | |
|---|---|---|---|
| 7,470,803 B2* | 12/2008 | Saso | .......................... C07F 7/12 556/427 |
| 10,197,917 B2* | 2/2019 | Nakajima | ............. G03F 7/0752 |
| 2012/0070994 A1 | 3/2012 | Kanno et al. | |

(Continued)

FOREIGN PATENT DOCUMENTS

| | | |
|---|---|---|
| JP | H06-342209 A | 12/1994 |
| JP | 2006-122748 A | 5/2006 |

(Continued)

OTHER PUBLICATIONS

Turowski et al., "Deuterium Isotope Effects on Hydrophobic Interactions: The Importance of Dispersion Interactions in the Hydrophobic Phase," Journal of the American Chemical Society, 2003, vol. 125, No. 45, pp. 13836-13849.

(Continued)

*Primary Examiner* — Cynthia Hamilton
(74) *Attorney, Agent, or Firm* — Oliff PLC

(57) ABSTRACT

The present invention provides a resist underlayer film-forming composition for lithography for forming a resist underlayer film that can be used as a hard mask with use of hydrolysis-condensation product of a hydrolyzable silane which also absorbs KrF laser. A resist underlayer film-forming composition for lithography comprising, as a silane, a hydrolyzable silane, a hydrolysis product thereof, or a hydrolysis-condensation product thereof, wherein the hydrolyzable silane includes a hydrolyzable silane of Formula (1):

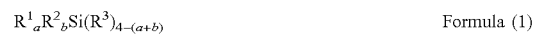

Formula (1)

[where $R^1$ is an organic group of Formula (2):

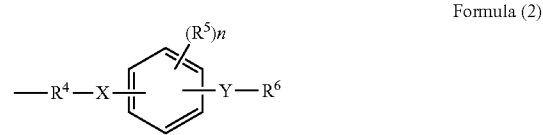

Formula (2)

and is bonded to a silicon atom through a Si—C bond; $R^3$ is an alkoxy group, an acyloxy group, or a halogen group; a is an integer of 1; b is an integer of 0 to 2; and a+b is an integer of 1 to 3], and a ratio of sulfur atoms to silicon atoms is 7% by mole or more in the whole of the silane. A resist underlayer film obtained by applying the resist underlayer film-forming composition onto a semiconductor substrate and baking it.

8 Claims, 4 Drawing Sheets

(56) References Cited

U.S. PATENT DOCUMENTS

2014/0170855 A1* 6/2014 Nakajima ............. G03F 7/0752
438/703
2017/0146906 A1* 5/2017 Nakajima ............. C09D 183/08

FOREIGN PATENT DOCUMENTS

| JP | 2006-178274 A | 7/2006 | | |
|---|---|---|---|---|
| JP | 2008-309929 A | 12/2008 | | |
| JP | 2014-157242 A | 8/2014 | | |
| WO | 2004/067540 A1 | 8/2004 | | |
| WO | 2006/013886 A1 | 2/2006 | | |
| WO | 2009/087981 A1 | 7/2009 | | |
| WO | 2010/140551 A1 | 12/2010 | | |
| WO | 2011/033965 A1 | 3/2011 | | |
| WO | 2013/022099 A1 | 2/2013 | | |
| WO | 2013/191203 A1 | 12/2013 | | |
| WO | WO-2015194555 A1 * | 12/2015 | ........... | G03F 7/0757 |

OTHER PUBLICATIONS

Tillman et al., "Oxidation of a Sulfide Group in a Self-Assembled Monolayer," Langmuir, 1989, vol. 5, No. 4, pp. 1020-1026.

Aug. 25, 2015 International Search Report issued in International Patent Application No. PCT/JP2015/067319.

Aug. 25, 2015 Written Opinion of the International Searching Authority issued in International Patent Application No. PCT/JP2015/067319.

\* cited by examiner

SILICON-CONTAINING RESIST UNDERLAYER FILM-FORMING COMPOSITION HAVING PHENYL GROUP-CONTAINING CHROMOPHORE

The present application is a continuation-in-part application of U.S. application Ser. No. 15/319,705 filed Dec. 16, 2016, which in turn is a U.S. national stage application of PCT/JP2015/067319 filed Jun. 16, 2015. The entire disclosures of these prior applications are incorporated herein by reference.

TECHNICAL FIELD

The present invention relates to a composition for forming an underlayer film between a substrate and a resist (such as photoresist or electron resist) for use in the manufacture of semiconductor devices. Specifically, the present invention relates to a resist underlayer film-forming composition for lithography for forming an underlayer film used as a layer under a photoresist in a lithography process for the manufacture of semiconductor devices. Furthermore, the present invention relates to a method for forming a resist pattern using the underlayer film-forming composition.

BACKGROUND ART

In the manufacture of semiconductor devices, fine processing by lithography using photoresists been conventionally performed. The fine processing is a processing method including: forming a photoresist thin film on a semiconductor substrate such as a silicon wafer; irradiating the thin film with an active ray such as ultraviolet ray through a mask pattern having a semiconductor device pattern depicted therein; carrying out development; and etching the substrate with the obtained photoresist pattern as a protective film, thereby forming fine projections and depressions corresponding to the pattern on the surface of the substrate. However, with the higher integration of semiconductor devices in recent years, an active ray to be used tends to have a shorter wavelength, namely, shift from KrF excimer laser (248 nm) to ArF excimer laser (193 nm). Accordingly, the influence of reflection of the active ray on a semiconductor substrate has become a serious problem.

A film known as a hard mask containing metal elements, such as silicon and titanium, has been used as an underlayer film between a semiconductor substrate and a photoresist. In this case, the photoresist and the hard mask are significantly different in components, and the rates to remove these by dry etching are greatly dependent on the types of gas used for dry etching. Therefore, the appropriate selection of a gas type allows the hard mask to be removed by dry etching without a large reduction in the film thickness of the photoresist. Thus, in the manufacture of semiconductor devices in recent years, a resist underlayer film has been increasingly disposed between a semiconductor substrate and a photoresist to achieve various effects such as an anti-reflection effect. Compositions for resist underlayer films have been studied, but, because of the diversity of characteristics demanded of the compositions, development of novel materials for resist underlayer films has been desired.

For example, a resist underlayer film including a polysiloxane containing a silane having a sulfone structure has been proposed (refer to Patent Document 1).

A resist underlayer film including a polysiloxane containing a silane having a sulfonamide structure has been proposed (refer to Patent Document 2).

A resist underlayer film including a polysiloxane containing a silane having a sulfone structure and an amine structure has been proposed (refer to Patent Document 3).

Resist underlayer films including a polysiloxane containing a silane having a sulfide bond have been proposed (refer to Patent Documents 4 and 5).

PRIOR ART DOCUMENTS

Patent Documents

Patent Document 1: WO 2013/022099
Patent Document 2: WO 2011/033965
Patent Document 3: WO 2013/191203
Patent Document 4: WO 2010/140551
Patent Document 5: Japanese Unexamined Patent Application Publication No. 2008-309929 (JP 2008-309929 A)

SUMMARY OF THE INVENTION

Problem to be Solved by the Invention

It is an object of the present invention to provide a resist underlayer film-forming composition for lithography that can be used for manufacturing semiconductor devices. Specifically, it is an object of the present invention to provide a resist underlayer film-forming composition for lithography for forming a resist underlayer film that can be used as a hard mask. Furthermore, it is an object of the present invention to provide a resist underlayer film-forming composition for lithography for forming a resist underlayer film that can be used as an anti-reflective coating. Furthermore, it is an object of the present invention to provide a resist underlayer film for lithography which does not intermix with a resist and whose dry etching rate is higher than that of the resist, and to provide a resist underlayer film-forming composition for forming the underlayer film.

In particular, it is an object of the present invention to provide a resist underlayer film-forming composition for forming a resist underlayer film that allows an excellent resist pattern shape to be formed when a resist as an upper layer is exposed to light and developed using an alkaline developing solution or an organic solvent, and that allows a rectangular resist pattern to be transferred to an underlayer by subsequent dry etching.

Furthermore, there has been a problem in that, in the case where a resist underlayer film formed from a resist underlayer film-forming composition is used as a hard mask, when a condensed ring structure of, for example, anthracene or phenanthrene, or a naphthalimide structure is used as a chromophore for KrF laser in a lithography process using the exposure wavelength of KrF (248 nm), the distillation purification of these components is difficult because the molecular weight thereof is large, and, as a result, the removal of metals as impurities in the manufacture of semiconductors is difficult. It is an object of the present invention to provide a resist underlayer film-forming composition that absorbs KrF laser and includes a chromophore having a low molecular weight, thereby allowing easy distillation purification.

Means for Solving the Problem

The present invention provides:

according to a first aspect, a resist underlayer film-forming composition for lithography, the composition comprising, as a silane, a hydrolyzable silane, a hydrolysis product thereof, or a hydrolysis-condensation product thereof, in which the hydrolyzable silane includes a hydrolyzable silane of Formula (1):

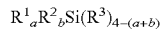  Formula (1)

[where $R^1$ is an organic group of Formula (2):

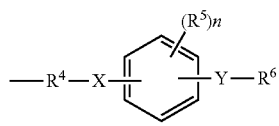  Formula (2)

(where each of X and Y is an oxygen atom or a sulfur atom, provided that X and Y are not the same atom at the same time; $R^6$ is an optionally substituted $C_{1-10}$ alkyl group; $R^4$ is an optionally substituted $C_{1-10}$ alkylene group; $R^5$ is an optionally substituted $C_{1-10}$ alkyl group; and n is an integer of 0 to 4), and is bonded to a silicon atom through a Si—C bond; $R^2$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, an amino group, or a cyano group, and is bonded to a silicon atom through a Si—C bond; $R^3$ is an alkoxy group, an acyloxy group, or a halogen group; a is an integer of 1; b is an integer of 0 to 2; and a+b is an integer of 1 to 3], and a ratio of sulfur atoms to silicon atoms is 7% by mole or more in the whole of the silane;

according to a second aspect, the resist underlayer film-forming composition for lithography according to the first aspect, in which the ratio of sulfur atoms to silicon atoms is 7% by mole to 50% by mole in the whole of the silane;

according to a third aspect, the resist underlayer film-forming composition according to the first aspect or the second aspect, in which the hydrolyzable silane is a combination of the hydrolyzable silane of Formula (1) and another hydrolyzable silane, and the other hydrolyzable silane is at least one hydrolyzable silane selected from the group consisting of a hydrolyzable silane of Formula (3):

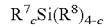  Formula (3)

(where $R^7$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, or a cyano group, and is bonded to a silicon atom through a Si—C bond; $R^8$ is an alkoxy group, an acyloxy group, or a halogen group; and c is an integer of 0 to 3) and a hydrolyzable silane of Formula (4):

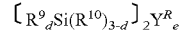  Formula(4)

(where $R^9$ is an alkyl group and is bonded to a silicon atom through a Si—C bond; $R^{10}$ is an alkoxy group, an acyloxy group, or a halogen group; $Y^R$ is an alkylene group or an arylene group; d is an integer of 0 or 1; and e is an integer of 0 or 1);

according to a fourth aspect, a resist underlayer film-forming composition, the composition comprising, as an underlayer film-forming polymer, a hydrolysis-condensation product of a hydrolyzable silane comprising a combination of the hydrolyzable silane of Formula (1) according to the first aspect and the hydrolyzable silane of Formula (3) according to the third aspect;

according to a fifth aspect, the resist underlayer film-forming composition according to any one of the first aspect to the fourth aspect, further comprising an acid as a hydrolysis catalyst;

according to a sixth aspect, the resist underlayer film-forming composition according to any one of the first aspect to the fifth aspect, further comprising water;

according to a seventh aspect, a resist underlayer film obtained by applying the resist underlayer film-forming composition according to any one of the first aspect to the sixth aspect onto a semiconductor substrate and baking the applied resist underlayer film-forming composition;

according to an eighth aspect, a method for manufacturing a semiconductor device, the method comprising the steps of: applying the resist underlayer film-forming composition according to any one of the first aspect to the sixth aspect onto a semiconductor substrate, and baking the applied resist underlayer film-forming composition to form a resist underlayer film; applying a resist composition onto the underlayer film to form a resist film; exposing the resist film to light; developing the resist after the exposure to obtain a resist pattern; etching the resist underlayer film with the resist pattern; and processing the semiconductor substrate with the patterned resist underlayer film;

according to a ninth aspect, a method for manufacturing a semiconductor device, the method comprising the steps of: forming an organic underlayer film on a semiconductor substrate; applying the resist underlayer film-forming composition according to any one of the first aspect to the sixth aspect onto the organic underlayer film, and baking the applied resist underlayer film-forming composition to form a resist underlayer film; applying a resist composition onto the resist underlayer film to form a resist film; exposing the resist film to light; developing the resist after the exposure to obtain a resist pattern; etching the resist underlayer film with the resist pattern; etching the organic underlayer film with the patterned resist underlayer film; and processing the semiconductor substrate with the patterned organic underlayer film; and according to a tenth aspect, a silane of Formula (1'):

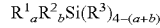  Formula (1')

[where $R^1$ is an organic group of Formula (2'):

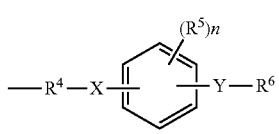  Formula (2')

(where each of X and Y is an oxygen atom or a sulfur atom, provided that X and Y are not the same atom at the same time; $R^6$ is an optionally substituted $C_{1-10}$ alkyl group; $R^4$ is an optionally substituted $C_{1-10}$ alkylene group; $R^5$ is an optionally substituted $C_{1-10}$ alkyl group; and n is an integer of 0 to 4) and is bonded to a silicon atom through a Si—C bond; $R^2$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, an amino group, or a cyano group, and is bonded to a silicon atom through a Si—C bond; R³ is an alkoxy group, an acyloxy group, or a halogen group; a is an integer of 1; b is an integer of 0 to 2; and a+b is an integer of 1 to 3].

Effects of the Invention

The resist underlayer film-forming composition for lithography of the present invention is capable of being used for the manufacture of semiconductor devices.

Furthermore, the resist underlayer film-forming composition for lithography of the present invention is capable of being used as a hard mask, and furthermore, is capable of being used as an anti-reflective coating, depending on the wavelength of an exposure light to be used. Furthermore, the composition does not intermix with a resist, and the dry etching rate of the composition is higher than that of the resist. Therefore, the resist underlayer film-forming composition for lithography of the present invention allows an excellent resist pattern shape to be formed when a resist serving as an upper layer is exposed to light and developed using an alkaline developing solution or an organic solvent, and allows a rectangular resist pattern to be transferred to an underlayer by subsequent dry etching.

Furthermore, the present invention provides:

a silane of Formula (1"):

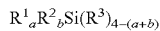
$$R^1{}_aR^2{}_bSi(R^3)_{4-(a+b)} \quad \text{Formula (1'')}$$

wherein R¹ is bonded to the silicon atom through a Si—C bond is an organic group of Formula (2"):

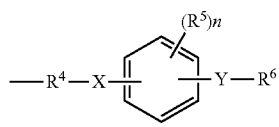

Formula (2")

wherein

X is an oxygen atom and Y is a sulfonamide group;

R⁶ is an optionally substituted $C_{1-10}$ alkyl group;

R⁴ is an optionally substituted $C_{1-10}$ alkylene group;

R⁵ is an optionally substituted $C_{1-10}$ alkyl group; and n is an integer of 0 to 4;

R² is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, an amino group, or a cyano group, and is bonded to a silicon atom through a Si—C bond;

R³ is an alkoxy group, an acyloxy group, or a halogen group;

a is an integer of 1;

b is an integer of 0 to 2; and a+b is an integer of 1 to 3.

Additionally, the present invention provides:

a silane of Formula (1"):

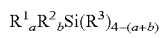
$$R^1{}_aR^2{}_bSi(R^3)_{4-(a+b)} \quad \text{Formula (1'')}$$

wherein R¹ is bonded to the silicon atom through a Si—C bond is an organic group of Formula (2"):

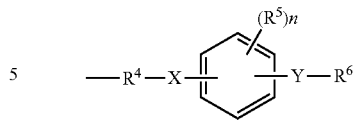

Formula (2")

wherein one of X and Y is an oxygen atom and the other of X and Y is a sulfonamide group;

R⁶ is an optionally substituted $C_{1-10}$ alkyl group;

R⁴ is an optionally substituted $C_{1-10}$ alkylene group;

R⁵ is an optionally substituted $C_{1-10}$ alkyl group; and n is an integer of 1 to 4;

R² is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, an amino group, or a cyano group, and is bonded to a silicon atom through a Si—C bond;

R³ is an alkoxy group, an acyloxy group, or a halogen group;

a is an integer of 1;

b is an integer of 0 to 2; and a+b is an integer of 1 to 3.

Furthermore, a hydrolyzable silane included in the resist underlayer film-forming composition of the present invention has a low molecular weight, and therefore can be easily purified by distillation. Accordingly, the resist underlayer film-forming composition of the present invention is formed into a resist underlayer film having a low metal impurity content, and therefore, makes it possible to manufacture a semiconductor product having less impurities even in a lithography process using the exposure wavelength of KrF (248 nm).

MODES FOR CARRYING OUT THE INVENTION

Figure 1:
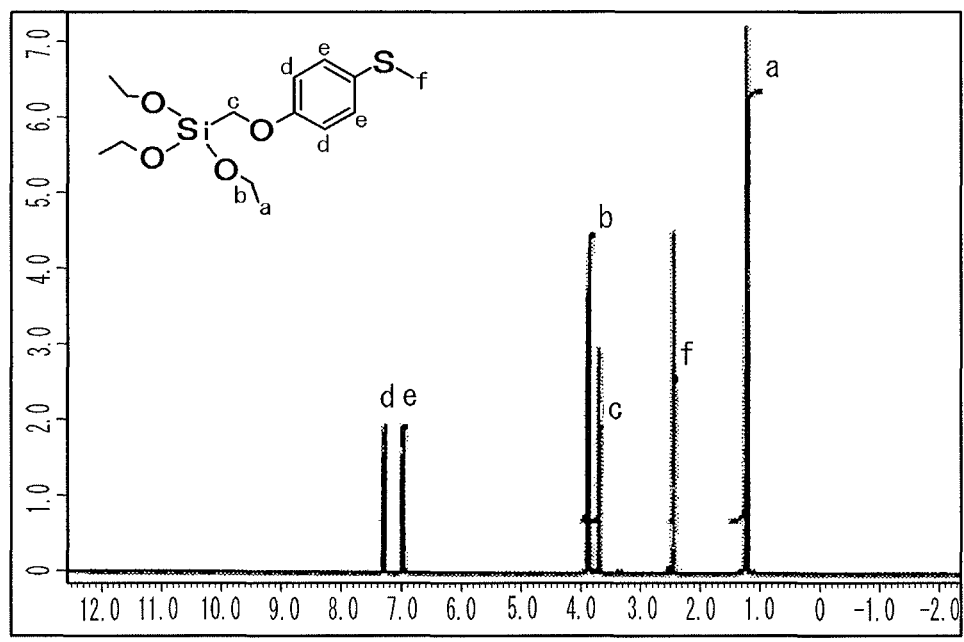
FIG. 1 is a graph showing an NMR spectrum of Compound 1.
Figure 2:
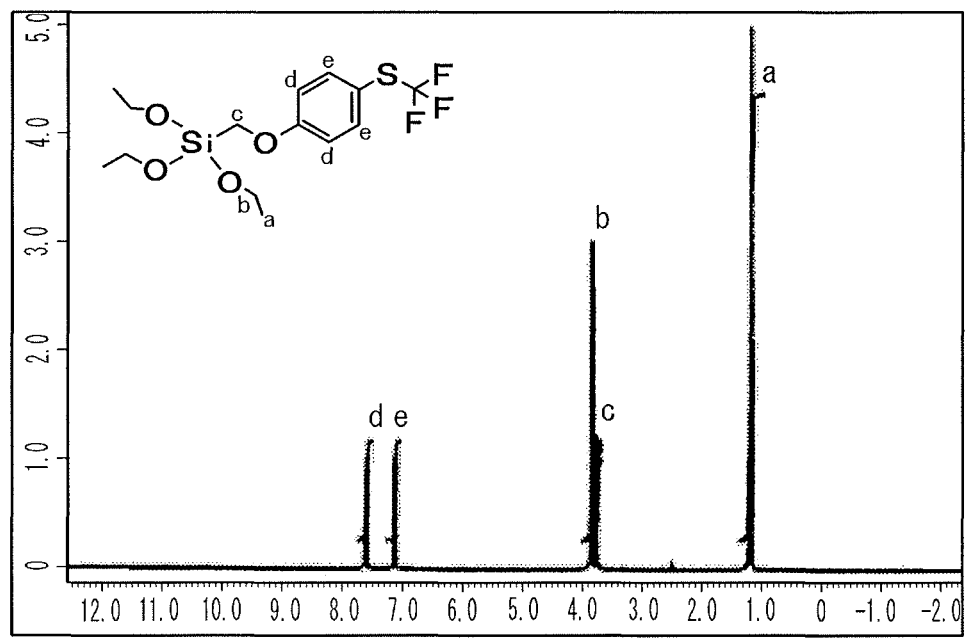
FIG. 2 is a graph showing an NMR spectrum of Compound 2.
Figure 3:
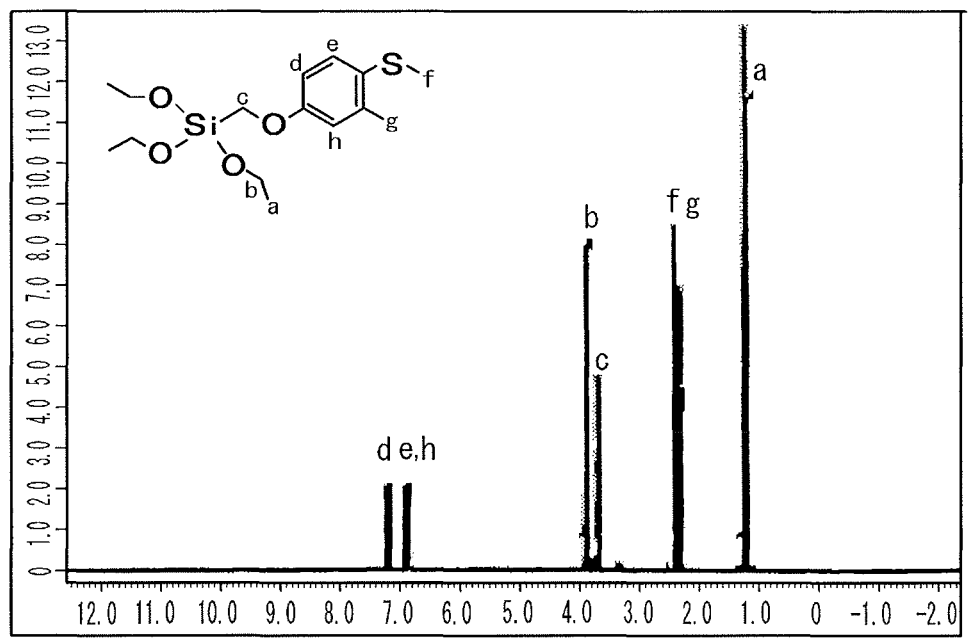
FIG. 3 is a graph showing an NMR spectrum of Compound 3.
Figure 4:
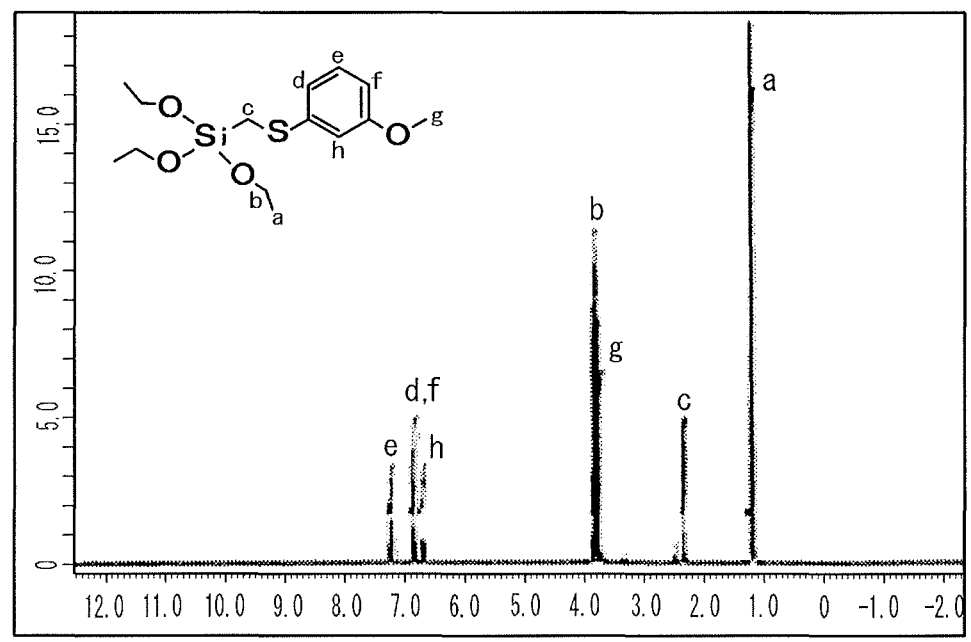
FIG. 4 is a graph showing an NMR spectrum of Compound 4.
Figure 5:
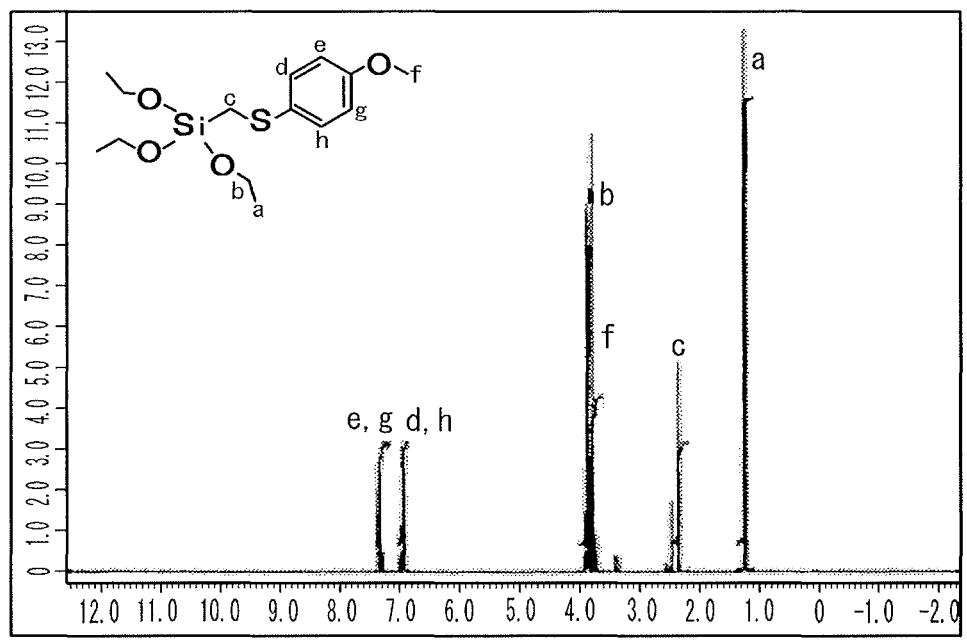
FIG. 5 is a graph showing an NMR spectrum of Compound 5.
Figure 6:
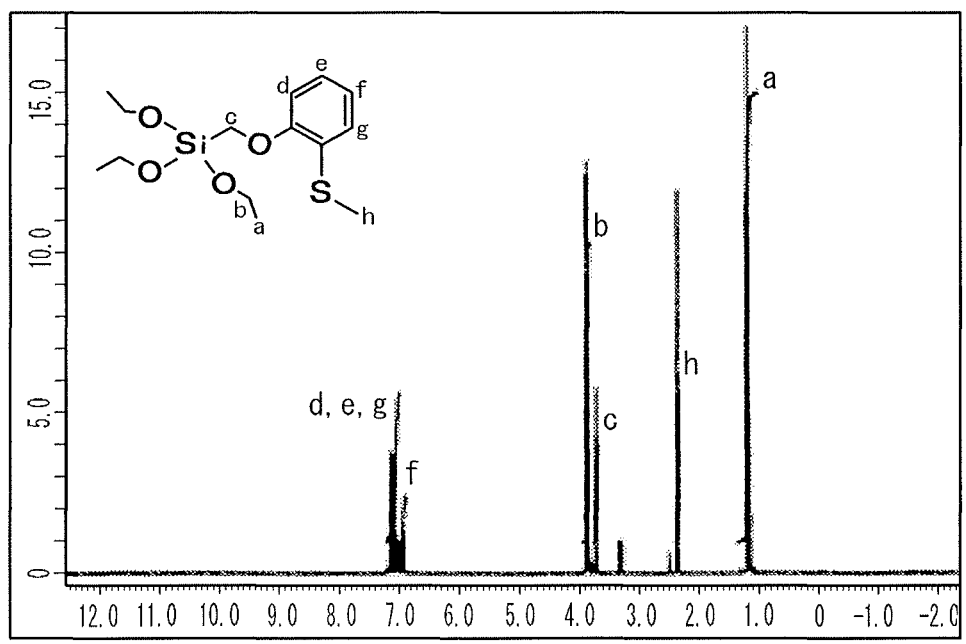
FIG. 6 is a graph showing an NMR spectrum of Compound 6.
Figure 7:
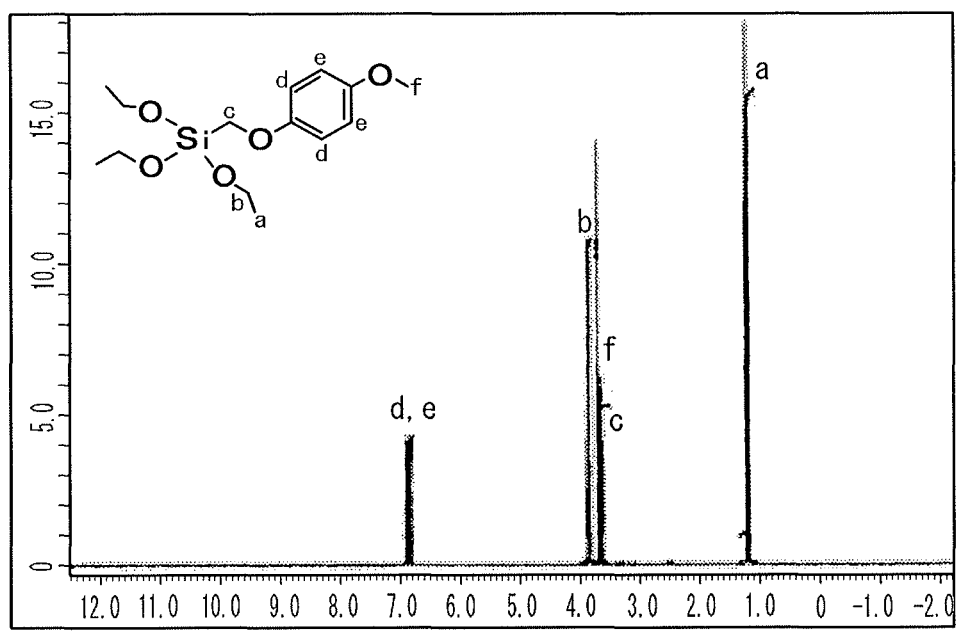
FIG. 7 is a graph showing an NMR spectrum of Comparative Compound 1.

The present invention provides a resist underlayer film-forming composition for lithography, the composition comprising, as a silane, a hydrolyzable silane, a hydrolysis product thereof, or a hydrolysis-condensation product thereof, in which the hydrolyzable silane includes a hydrolyzable silane of Formula (1), and the ratio of sulfur atoms to silicon atoms in the whole of the silane is 7% by mole or more. In Formula (1), R¹ is an organic group of Formula (2) and is bonded to a silicon atom through a Si—C bond. R² is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, an amino group, or a cyano group, and is bonded to a silicon atom through a Si—C bond. $R^3$ is an alkoxy group, an acyloxy group, or a halogen group. a is an integer of 1, b is an integer of 0 to 2, and a+b is an integer of 1 to 3.

In Formula (2), each of X and Y is an oxygen atom or a sulfur atom. However, X and Y are not the same atom at the same time. That is, in the present invention, X is an oxygen atom and Y is a sulfur atom, or, alternatively, X is a sulfur atom and Y is an oxygen atom. The use of a sulfur atom enables a sulfide bond to be formed. The use of an oxygen atom enables an ether bond to be formed.

$R^6$ is an optionally substituted $C_{1-10}$ alkyl group, $R^4$ is an optionally substituted $C_{1-10}$ alkylene group, and $R^5$ is an optionally substituted $C_{1-10}$ alkyl group. n is an integer of 0 to 4. A portion of $R^4$ is bonded to the Si atom.

In the whole of the silane, the silane of Formula (1) may be used in a range of 50% by mole or less, 5% by mole to 50% by mole, 7% by mole to 50% by mole, 7% by mole to 40% by mole, 7% by mole to 35% by mole, 7% by mole to 30% by mole, 7% by mole to 20% by mole, 10% by mole to 50% by mole, 10% by mole to 45% by mole, 10% by mole to 40% by mole, 10% by mole to 35% by mole, 10% by mole to 30% by mole, or 7% by mole to 20% by mole.

The resist underlayer film-forming composition of the present invention includes a hydrolyzable silane of Formula (1), or a hydrolyzable silane of Formula (1) and another hydrolyzable silane (for example, a hydrolyzable silane of Formula (3)), a hydrolysis product thereof, or a hydrolysis-condensation product thereof, and a solvent. Furthermore, the resist underlayer film-forming composition may include an acid, water, alcohol, a curing catalyst, an acid generator, other organic polymers, a light-absorbing compound, and a surfactant, as optional components.

The resist underlayer film forming composition of the present invention has a solid content of, for example, 0.1% by mass to 50% by mass, 0.1% by mass to 30% by mass, or 0.1% by mass to 25% by mass. Here, the solid content means a content obtained by subtracting a solvent component from all components of the resist underlayer film-forming composition.

The ratio of the hydrolyzable silane, the hydrolysis product thereof, and the hydrolysis-condensation product thereof in the solid content is 20% by mass or more, for example, 50% by mass to 100% by mass, 60% by mass to 99% by mass, or 70% by mass to 99% by mass.

The above-mentioned alkyl group may be a linear or branched $C_{1-10}$ alkyl group, and examples of the alkyl group include methyl group, ethyl group, n-propyl group, i-propyl group, n-butyl group, i-butyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, and 1-ethyl-2-methyl-n-propyl group.

Furthermore, a cyclic alkyl group may be used, and examples of the cyclic $C_{1-10}$ alkyl group include cyclopropyl group, cyclobutyl group, 1-methyl-cyclopropyl group, 2-methyl-cyclopropyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group. These examples are also applied to an alkyl group portion of the above-mentioned halogenated alkyl group.

The above-mentioned alkylene group may be, for example, an alkylene group derived from the above-mentioned alkyl group. Examples of the alkylene group include methylene group derived from methyl group, ethylene group derived from ethyl group, and propylene group derived from propyl group.

The above-mentioned alkenyl group may be, for example, a $C_{2-10}$ alkenyl group, and examples of the alkenyl group include ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butylethenyl group, 2,2-dimethyl-3-butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, 1-i-propyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group, and 3-cyclohexenyl group.

The above-mentioned aryl group may be, for example, a $C_{6-20}$ aryl group, and examples of the aryl group include phenyl group, o-methylphenyl group, m-methylphenyl group, p-methylphenyl group, o-chlorophenyl group, m-chlorophenyl group, p-chlorophenyl group, o-fluorophenyl group, p-mercaptophenyl group, o-methoxyphenyl group, p-methoxyphenyl group, p-aminophenyl group, p-cyanophenyl group, α-naphthyl group, β-naphthyl group, o-biphenylyl group, m-biphenylyl group, p-biphenylyl group, 1-anthryl group, 2-anthryl group, 9-anthryl group, 1-phenanthryl group, 2-phenanthryl group, 3-phenanthryl group, 4-phenanthryl group, and 9-phenanthryl group. These examples are also applied to aryl group portions of the above-mentioned halogenated aryl group and the above-mentioned alkoxyaryl group.

Furthermore, examples of the above-mentioned arylene group may include divalent organic groups derived from the above-mentioned aryl groups.

Examples of the above-mentioned organic group having an epoxy group include glycidoxymethyl, glycidoxyethyl, glycidoxypropyl, glycidoxybutyl, and epoxycyclohexyl.

Examples of the above-mentioned organic group having an acryloyl group include acryloylmethyl, acryloylethyl, and acryloylpropyl.

Examples of the above-mentioned organic group having a methacryloyl group include methacryloylmethyl, methacryloylethyl, and methacryloylpropyl.

Examples of the above-mentioned organic group having a mercapto group include ethylmercapto group, butylmercapto group, hexylmercapto group, and octylmercapto group.

Examples of the above-mentioned organic group having an amino group include aminomethyl group, aminoethyl group, and aminopropyl group.

Examples of the above-mentioned organic group having a cyano group include cyanoethyl group and cyanopropyl group.

The above-mentioned alkoxy group may be, for example, an alkoxy group having a $C_{1-20}$ linear, branched, or cyclic alkyl portion. Examples of the alkoxy group include methoxy group, ethoxy group, n-propoxy group, i-propoxy group, n-butoxy group, i-butoxy group, s-butoxy group, t-butoxy group, n-pentyloxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group, and 1-ethyl-2-methyl-n-propoxy group; and examples of the cyclic alkoxy group include cyclopropoxy group, cyclobutoxy group, 1-methyl-cyclopropoxy group, 2-methyl-cyclopropoxy group, cyclopentyloxy group, 1-methyl-cyclobutoxy group, 2-methyl-cyclobutoxy group, 3-methyl-cyclobutoxy group, 1,2-dimethyl-cyclopropoxy group, 2,3-dimethyl-cyclopropoxy group, 1-ethyl-cyclopropoxy group, 2-ethyl-cyclopropoxy group, cyclohexyloxy group, 1-methyl-cyclopentyloxy group, 2-methyl-cyclopentyloxy group, 3-methyl-cyclopentyloxy group, 1-ethyl-cyclobutoxy group, 2-ethyl-cyclobutoxy group, 3-ethyl-cyclobutoxy group, 1,2-dimethyl-cyclobutoxy group, 1,3-dimethyl-cyclobutoxy group, 2,2-dimethyl-cyclobutoxy group, 2,3-dimethyl-cyclobutoxy group, 2,4-dimethyl-cyclobutoxy group, 3,3-dimethyl-cyclobutoxy group, 1-n-propyl-cyclopropoxy group, 2-n-propyl-cyclopropoxy group, 1-i-propyl-cyclopropoxy group, 2-i-propyl-cyclopropoxy group, 1,2,2-trimethyl-cyclopropoxy group, 1,2,3-trimethyl-cyclopropoxy group, 2,2,3-trimethyl-cyclopropoxy group, 1-ethyl-2-methyl-cyclopropoxy group, 2-ethyl-1-methyl-cyclopropoxy group, 2-ethyl-2-methyl-cyclopropoxy group, and 2-ethyl-3-methyl-cyclopropoxy group. These examples are also applied to an alkoxy group portion of the above-mentioned alkoxyaryl group.

The above-mentioned acyloxy group may be, for example, a $C_{2-20}$ acyloxy group, and examples of the acyloxy group include methylcarbonyloxy group, ethylcarbonyloxy group, n-propylcarbonyloxy group, i-propylcarbonyloxy group, n-butylcarbonyloxy group, i-butylcarbonyloxy group, s-butylcarbonyloxy group, t-butylcarbonyloxy group, n-pentylcarbonyloxy group, 1-methyl-n-butylcarbonyloxy group, 2-methyl-n-butylcarbonyloxy group, 3-methyl-n-butylcarbonyloxy group, 1,1-dimethyl-n-propylcarbonyloxy group, 1,2-dimethyl-n-propylcarbonyloxy group, 2,2-dimethyl-n-propylcarbonyloxy group, 1-ethyl-n-propylcarbonyloxy group, n-hexylcarbonyloxy group, 1-methyl-n-pentylcarbonyloxy group, 2-methyl-n-pentylcarbonyloxy group, 3-methyl-n-pentylcarbonyloxy group, 4-methyl-n-pentylcarbonyloxy group, 1,1-dimethyl-n-butylcarbonyloxy group, 1,2-dimethyl-n-butylcarbonyloxy group, 1,3-dimethyl-n-butylcarbonyloxy group, 2,2-dimethyl-n-butylcarbonyloxy group, 2,3-dimethyl-n-butylcarbonyloxy group, 3,3-dimethyl-n-butylcarbonyloxy group, 1-ethyl-n-butylcarbonyloxy group, 2-ethyl-n-butylcarbonyloxy group, 1,1,2-trimethyl-n-propylcarbonyloxy group, 1,2,2-trimethyl-n-propylcarbonyloxy group, 1-ethyl-1-methyl-n-propylcarbonyloxy group, 1-ethyl-2-methyl-n-propylcarbonyloxy group, phenylcarbonyloxy group, and tosylcarbonyloxy group.

Examples of the above-mentioned halogen group include a fluorine atom, a chlorine atom, a bromine atom, and an iodine atom. These examples are also applied to halogen group portions of the above-mentioned halogenated alkyl group and the above-mentioned halogenated aryl group.

Examples of the hydrolyzable silane of Formula (1) are as follows.

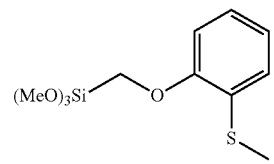

Formula (1-1)

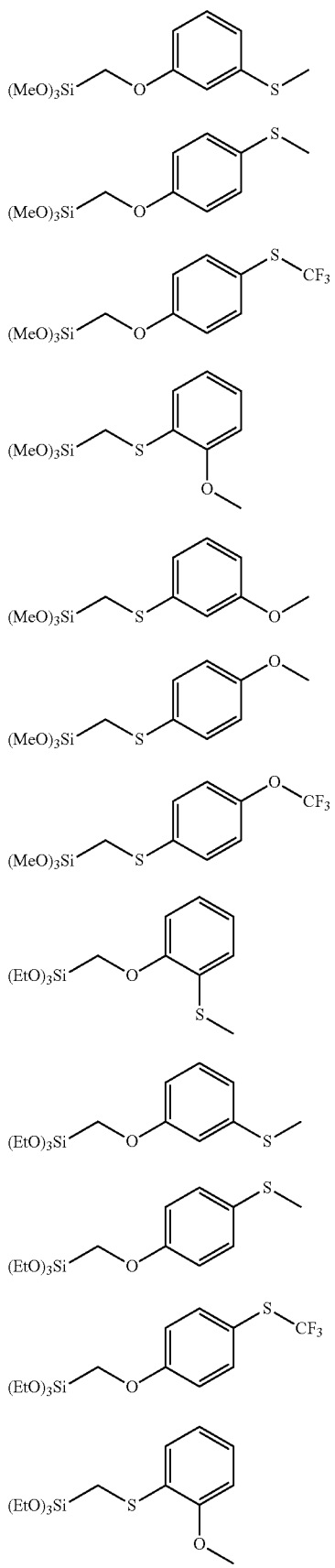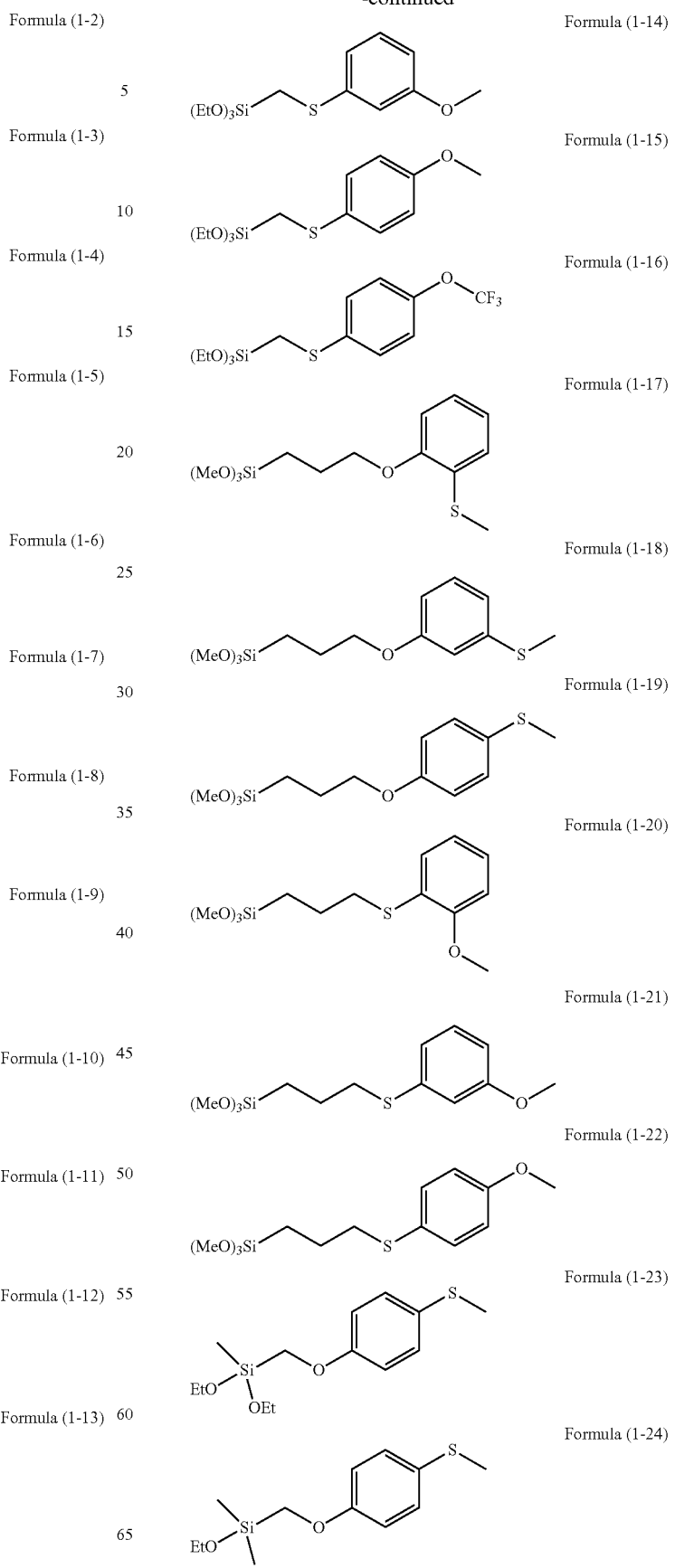

Formula (1-25)
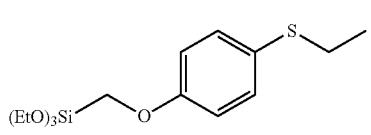

Formula (1-26)
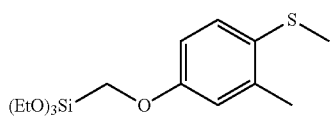

Formula (1-27)
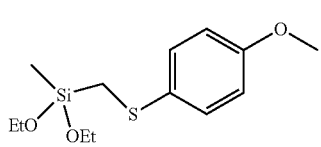

Formula (1-28)
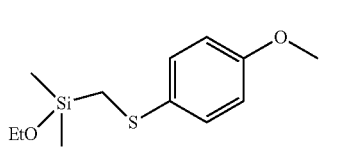

Formula (1-29)
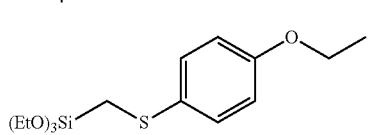

Formula (1-30)
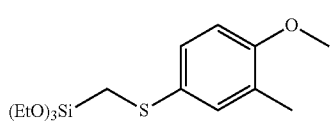

In the present invention, the hydrolyzable silane is a combination of the hydrolyzable silane of Formula (1) and another hydrolyzable silane, and as the other hydrolyzable silane, at least one hydrolyzable silane selected from the group consisting of hydrolyzable silanes of Formula (3) and Formula (4) below may be used.

  Formula (3)

In Formula (3), $R^7$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, or a cyano group, and is bonded to a silicon atom through a Si—C bond; $R^8$ is an alkoxy group, an acyloxy group, or a halogen group; and c is an integer of 0 to 3.

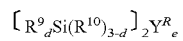  Formula (4)

In Formula (4), $R^9$ is an alkyl group and is bonded to a silicon atom through a Si—C bond; $R^{10}$ is an alkoxy group, an acyloxy group, or a halogen group; $Y^R$ is an alkylene group or an arylene group; d is an integer of 0 or 1; and e is an integer of 0 or 1.

As the alkyl group; the aryl group; the halogenated alkyl group; the halogenated aryl group; the alkoxyaryl group; the alkenyl group; or the organic group having an epoxy group, an acryloyl group, a methacryloyl group, a mercapto group, or a cyano group; the alkoxy group; the acyloxy group; the halogen group; the alkylene group; and the arylene group, which are defined in Formula (3) and Formula (4), the above-mentioned examples may be used.

Examples of the silicon-containing compound of Formula (3) include tetramethoxysilane, tetrachlorosilane, tetraacetoxysilane, tetraethoxysilane, tetra-n-propoxysilane, tetraisopropoxysilane, tetra-n-butoxysilane, methyltrimethoxysilane, methyltrichlorosilane, methyltriacetoxysilane, methyltripropoxysilane, methyltributoxysilane, methyltriamyloxysilane, methyltriphenoxysilane, methyltribenzyloxysilane, methyltriphenethyloxysilane, glycidoxymethyltrimethoxysilane, glycidoxymethyltriethoxysilane, α-glycidoxyethyltrimethoxysilane, α-glycidoxyethyltriethoxysilane, β-glycidoxyethyltrimethoxysilane, β-glycidoxyethyltriethoxysilane, α-glycidoxypropyltrimethoxysilane, α-glycidoxypropyltriethoxysilane, β-glycidoxypropyltrimethoxysilane, β-glycidoxypropyltriethoxysilane, γ-glycidoxypropyltrimethoxysilane, γ-glycidoxypropyltriethoxysilane, γ-glycidoxypropyltripropoxysilane, γ-glycidoxypropyltributoxysilane, γ-glycidoxypropyltriphenoxysilane, α-glycidoxybutyltrimethoxysilane, α-glycidoxybutyltriethoxysilane, β-glycidoxybutyltriethoxysilane, γ-glycidoxybutyltrimethoxysilane, γ-glycidoxybutyltriethoxysilane, δ-glycidoxybutyltrimethoxysilane, δ-glycidoxybutyltriethoxysilane, (3,4-epoxycyclohexyl)methyltrimethoxysilane, (3,4-epoxycyclohexyl)methyltriethoxysilane, β-(3,4-epoxycyclohexyl)ethyltrimethoxysilane, β-(3,4-epoxycyclohexyl)ethyltriethoxysilane, β-(3,4-epoxycyclohexyl)ethyltripropoxysilane, β-(3,4-epoxycyclohexyl)ethyltributoxysilane, β-(3,4-epoxycyclohexyl)ethyltriphenoxysilane, γ-(3,4-epoxycyclohexyl)propyltrimethoxysilane, γ-(3,4-epoxycyclohexyl)propyltriethoxysilane, δ-(3,4-epoxycyclohexyl)butyltrimethoxysilane, δ-(3,4-epoxycyclohexyl)butyltriethoxysilane, glycidoxymethylmethyldimethoxysilane, glycidoxymethylmethyldiethoxysilane, α-glycidoxyethylmethyldimethoxysilane, α-glycidoxyethylmethyldiethoxysilane, β-glycidoxyethylmethyldimethoxysilane, β-glycidoxyethylethyldimethoxysilane, α-glycidoxypropylmethyldimethoxysilane, α-glycidoxypropylmethyldiethoxysilane, β-glycidoxypropylmethyldimethoxysilane, β-glycidoxypropylethyldimethoxysilane, γ-glycidoxypropylmethyldimethoxysilane, γ-glycidoxypropylmethyldiethoxysilane, γ-glycidoxypropylmethyldipropoxysilane, γ-glycidoxypropylmethyldibutoxysilane, γ-glycidoxypropylmethyldiphenoxysilane, γ-glycidoxypropylethyldimethoxysilane, γ-glycidoxypropylethyldiethoxysilane, γ-glycidoxypropylvinyldimethoxysilane, γ-glycidoxypropylvinyldiethoxysilane, ethyltrimethoxysilane, ethyltriethoxysilane, vinyltrimethoxysilane, vinyltrichlorosilane, vinyltriacetoxysilane, vinyltriethoxysilane, vinyltriacetoxysilane, methoxyphenyltrimethoxysilane, methoxyphenyltriethoxysilane, methoxyphenyltriacetoxysilane, methoxyphenyltrichlorosilane, methoxybenzyltrimethoxysilane, methoxybenzyltriethoxysilane, methoxybenzyltriacetoxysilane, methoxybenzyltrichlorosilane, methoxyphenethyltrimethoxysilane, methoxyphenethyltriethoxysilane, methoxyphenethyltriacetoxysilane, methoxyphenethyltrichlorosilane, ethoxyphenyltrimethoxysilane, ethoxyphenyltriethoxysilane, ethoxyphenyltriacetoxysilane, ethoxyphenyltrichlorosilane, ethoxybenzyltrimethoxysilane, ethoxybenzyltriethoxysilane, ethoxybenzyltriacetoxysilane, ethoxybenzyltrichlorosilane, isopropoxyphenyltrimethoxysilane, isopropoxyphenyltriethoxysilane, isopropoxyphenyltriacetoxysilane, isopropoxyphenyltrichlorosilane, isopropoxybenzyltrimethoxysilane, isopropoxybenzyltriethoxysilane, isopropoxybenzyltriacetoxysilane, isopropoxybenzyltrichlorosilane, t-butoxyphenyltrimethoxysilane, t-butoxyphenyltriethoxysilane, t-butoxyphenyltriacetoxysilane, t-butoxyphenyltrichlorosilane, t-butoxybenzyltrimethoxysilane, t-butoxybenzyltriethoxysilane, t-butoxybenzyltriacetoxysilane, t-butoxybenzyltrichlorosilane, methoxynaphthyltrimethoxysilane, methoxynaphthyltriethoxysilane, methoxynaphthyltriacetoxysilane, methoxynaphthyltrichlorosilane, ethoxynaphthyltrimethoxysilane, ethoxynaphthyltriethoxysilane, ethoxynaphthyltriacetoxysilane, ethoxynaphthyltrichlorosilane, γ-chloropropyltrimethoxysilane, γ-chloropropyltriethoxysilane, γ-chloropropyltriacetoxysilane, 3,3,3-trifluoropropyltrimethoxysilane, γ-methacryloxypropyltrimethoxysilane, γ-mercaptopropyltrimethoxysilane, γ-mercaptopropyltriethoxysilane, β-cyanoethyltriethoxysilane, chloromethyltrimethoxysilane, chloromethyltriethoxysilane, dimethyldimethoxysilane, phenylmethyldimethoxysilane, dimethyldiethoxysilane, phenylmethyldiethoxysilane, γ-chloropropylmethyldimethoxysilane, γ-chloropropylmethyldiethoxysilane, dimethyldiacetoxysilane, γ-methacryloxypropylmethyldimethoxysilane, γ-methacryloxypropylmethyldiethoxysilane, γ-mercaptopropylmethyldimethoxysilane, γ-mercaptomethyldiethoxysilane, methylvinyldimethoxysilane, and methylvinyldiethoxysilane.

Furthermore, the following hydrolyzable silanes may be used.

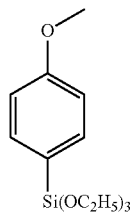

Formula (A-1)

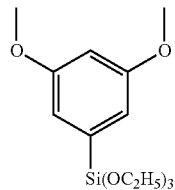

Formula (A-2)

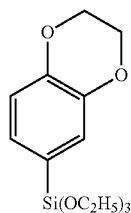

Formula (A-3)

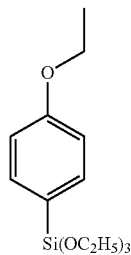

Formula (A-4)

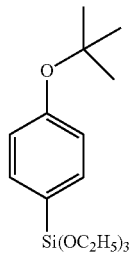

Formula (A-5)

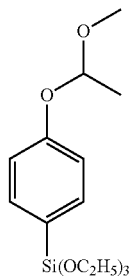

Formula (A-6)

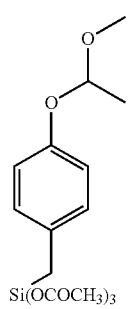

Formula (A-7)

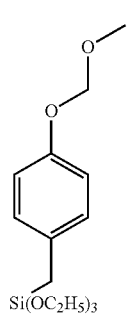

Formula (A-8)

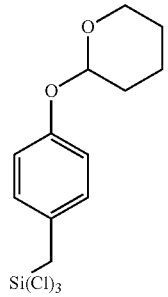

Formula (A-9)

Formula (A-10)
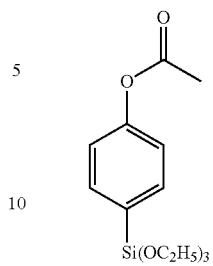
Formula (A-11)
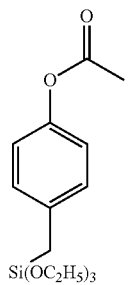
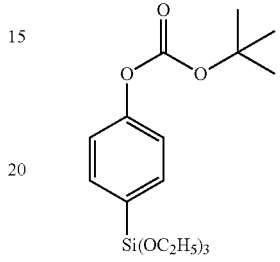
Formula (A-12)
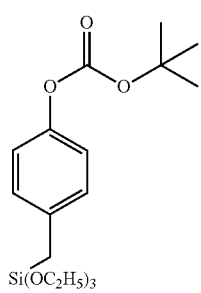
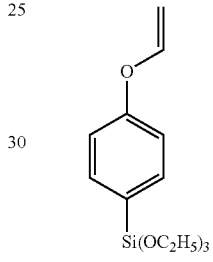
Formula (A-13)
Formula (A-15)
Formula (A-16)
Formula (A-17)
Formula (A-18)
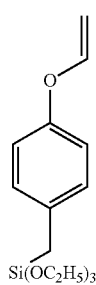
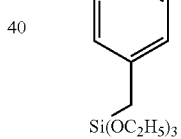
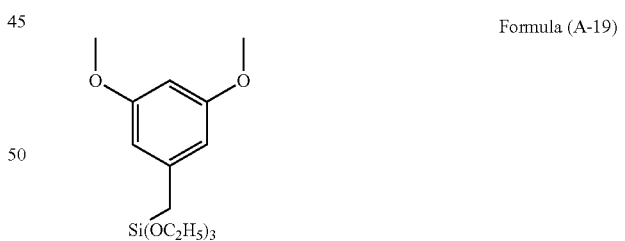
Formula (A-19)
Formula (A-14)
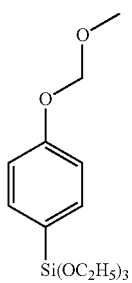
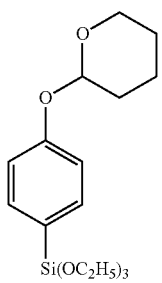
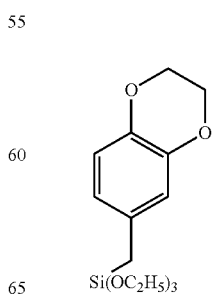
Formula (A-20)

-continued
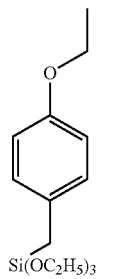
Formula (A-21)
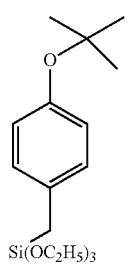
Formula (A-22)
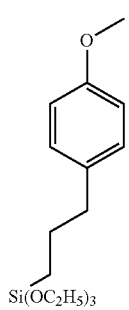
Formula (A-23)
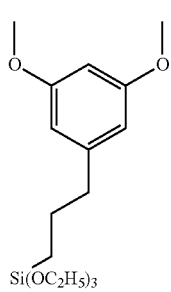
Formula (A-24)
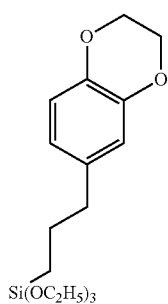
Formula (A-25)
-continued
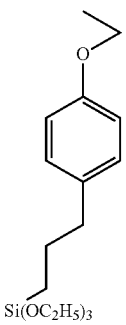
Formula (A-26)
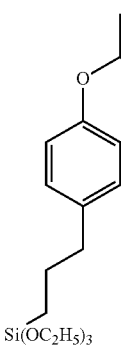
Formula (A-27)
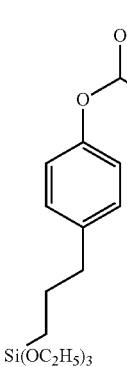
Formula (A-28)
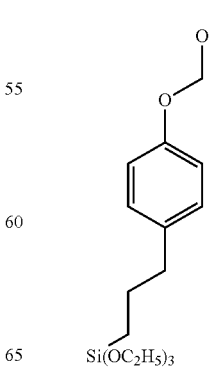
Formula (A-29)

-continued
Formula (A-30)
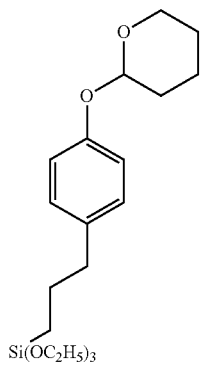
Formula (A-31)
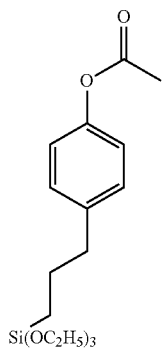
Formula (A-32)
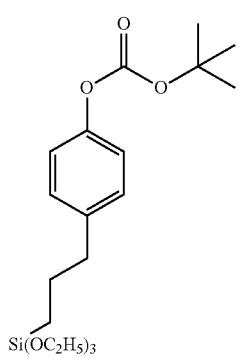
Formula (A-33)
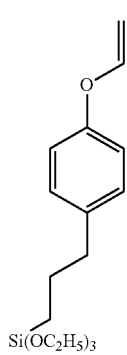
Formula (A-34)
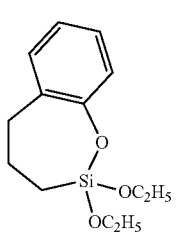
-continued
Formula (A-35)
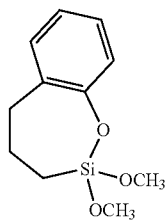
Formula (A-36)
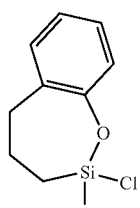
Formula (A-37)
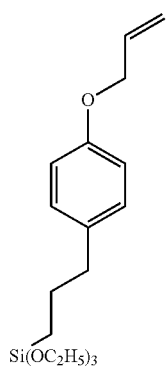
Formula (A-38)
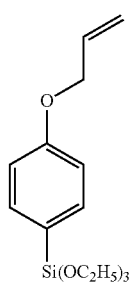
Formula (A-39)
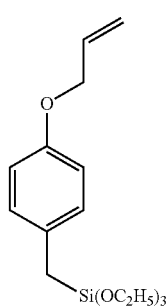

Formula (A-40)

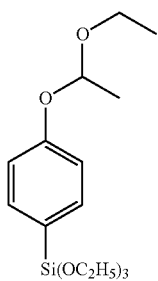

Formula (A-41)

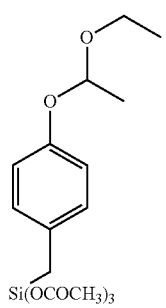

Examples of the silicon-containing compound of Formula (4) include methylenebistrimethoxysilane, methylenebistrichlorosilane, methylenebistriacetoxysilane, ethylenebistriethoxysilane, ethylenebistrichlorosilane, ethylenebistriacetoxysilane, propylenebistriethoxysilane, butylenebistrimethoxysilane, phenylenebistrimethoxysilane, phenylenebistriethoxysilane, phenylenebismethyldiethoxysilane, phenylenebismethyldimethoxysilane, naphthylenebistrimethoxysilane, bistrimethoxydisilane, bistriethoxydisilane, bisethyldiethoxydisilane, and bismethyldimethoxydisilane.

In the present invention, furthermore, a silane having a sulfone group and a silane having a sulfonamide group may be used as the hydrolyzable silane, and examples of these silanes are as follows.

Formula (B-1)

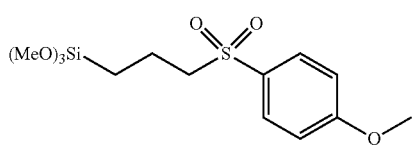

Formula (B-2)

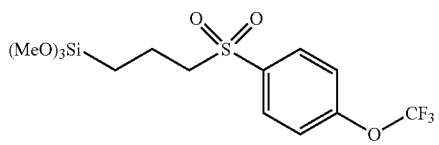

Formula (B-3)

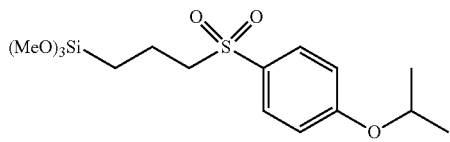

Formula (B-4)

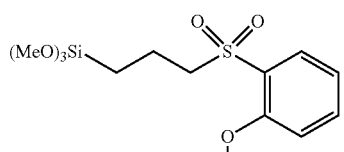

Formula (B-5)

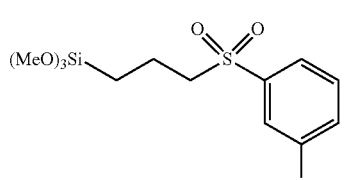

Formula (B-6)

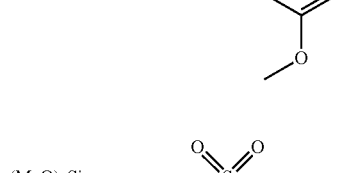

Formula (B-7)

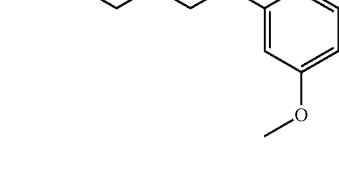

Formula (B-8)

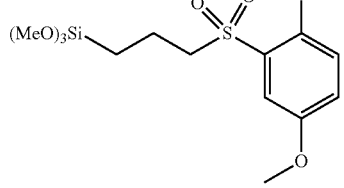

Formula (B-9)

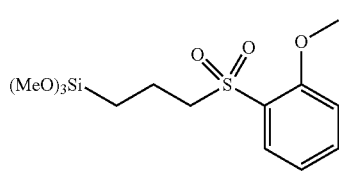

Formula (B-10)

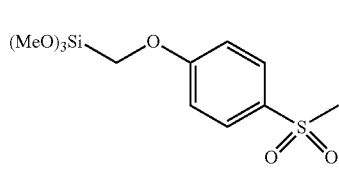

Formula (B-11)

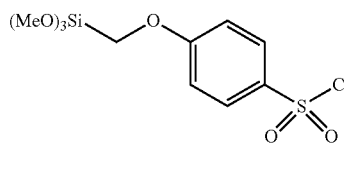

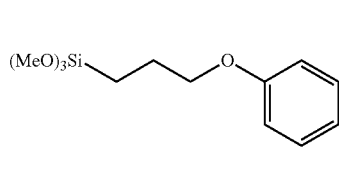

Formula (B-12)
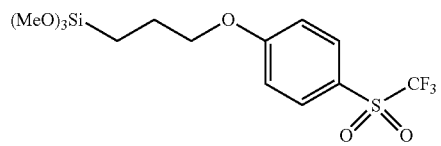
Formula (B-13)
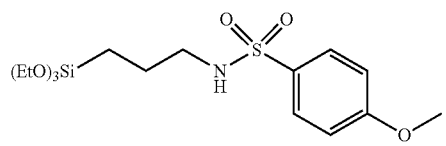
Formula (B-14)
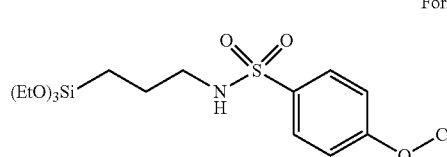
Formula (B-15)
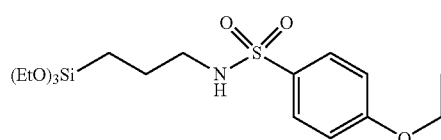
Formula (B-16)
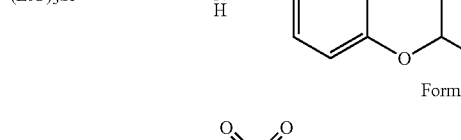
Formula (B-17)
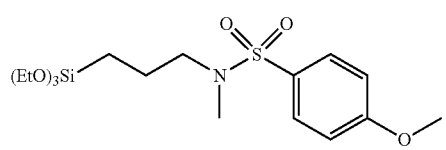
Formula (B-18)
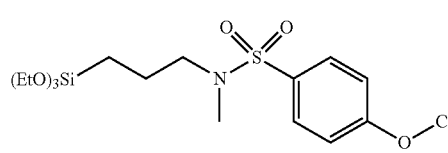
Formula (B-19)
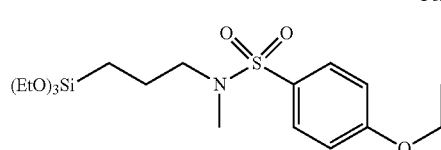
Formula (B-20)
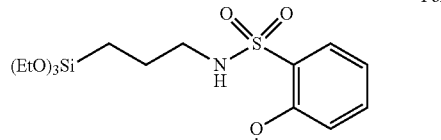
Formula (B-21)
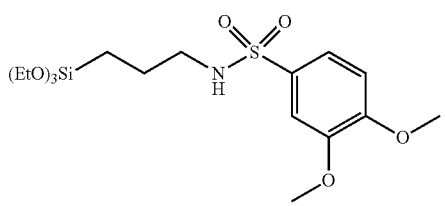
Formula (B-22)
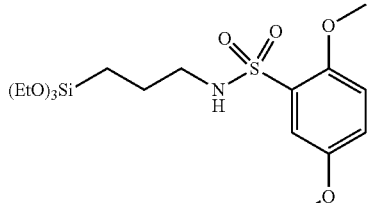
Formula (B-23)
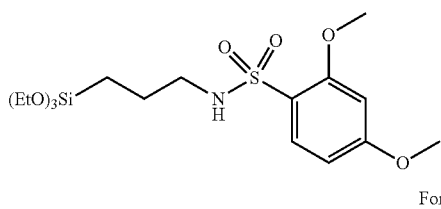
Formula (B-24)
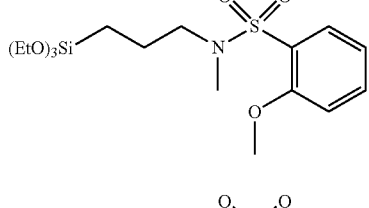
Formula (B-25)
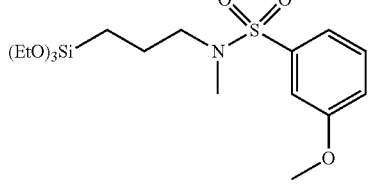
Formula (B-26)
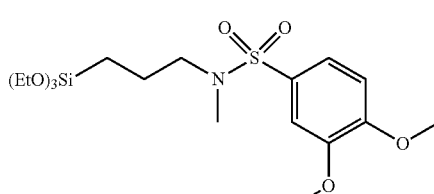
Formula (B-27)
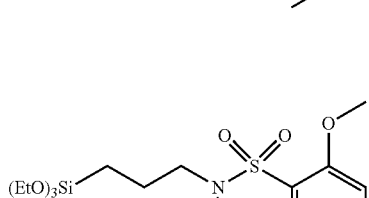

Formula (B-28)
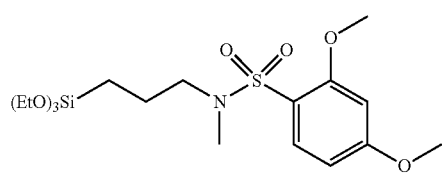
Formula (B-29)
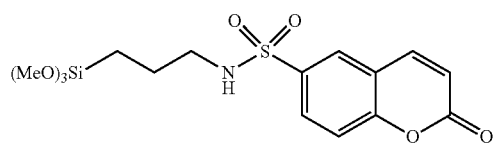
Formula (B-30)
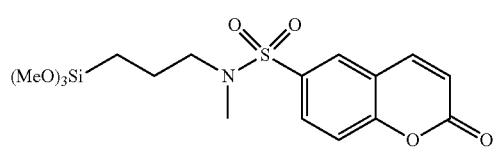
Formula (B-31)
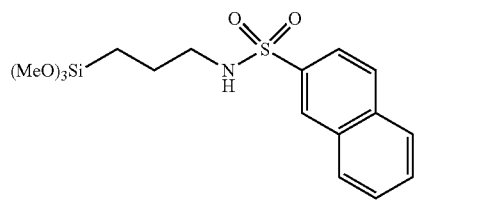
Formula (B-32)
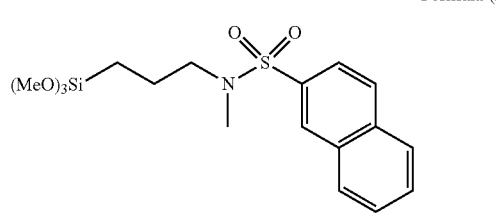
Formula (B-33)
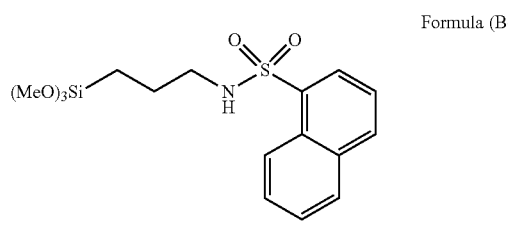
Formula (B-34)
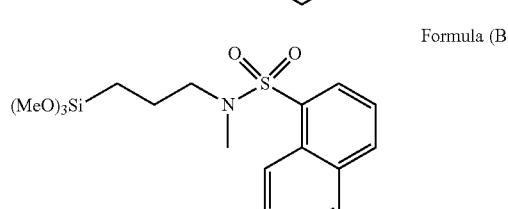
Formula (B-35)
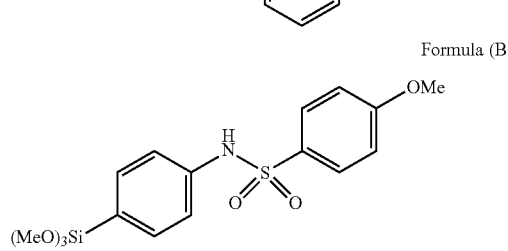
Formula (B-36)
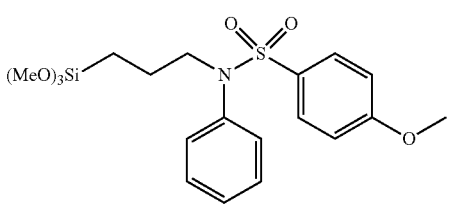
Specific examples of the hydrolysis-condensation product (polysiloxane) used in the present invention are as follows.
Formula (3-1)
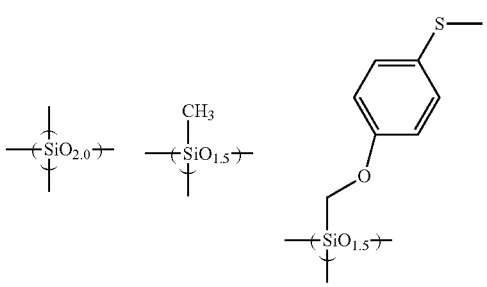
Formula (3-2)
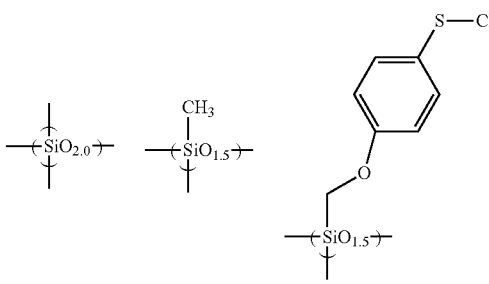
Formula (3-3)
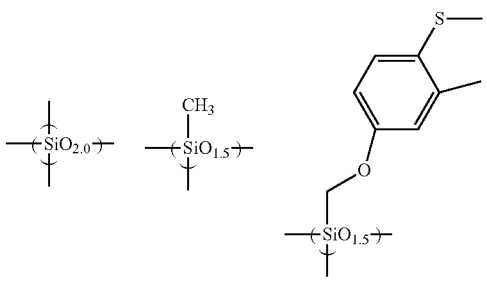
Formula (3-4)
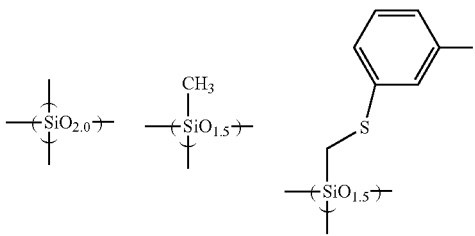

Formula (3-5)
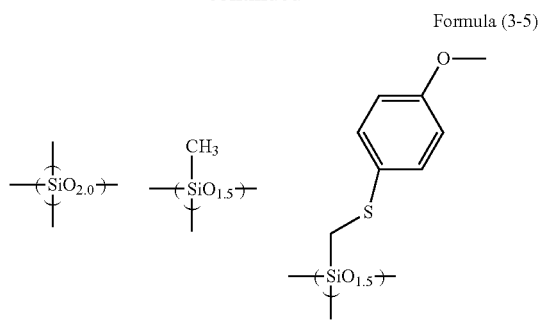

Formula (3-6)
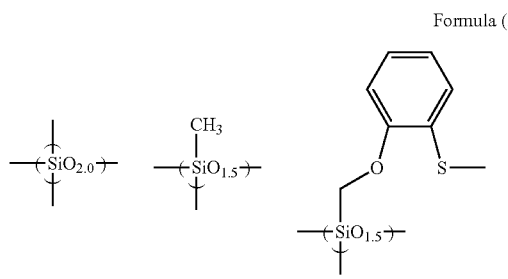

Formula (3-7)
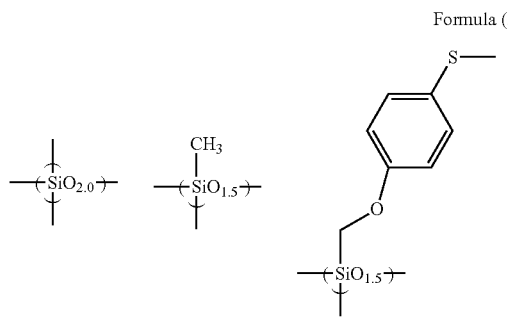

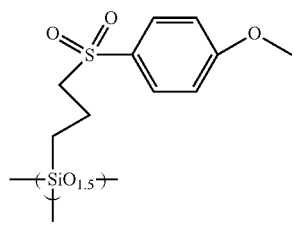

Formula (3-8)
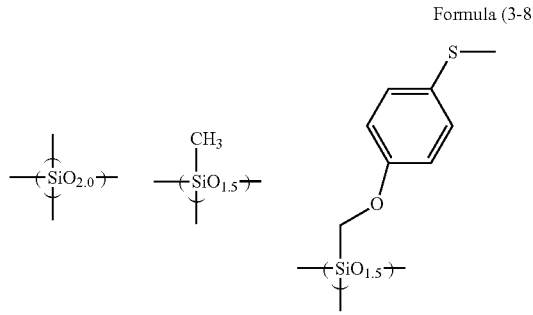

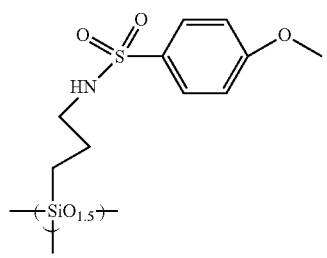

Formula (3-9)
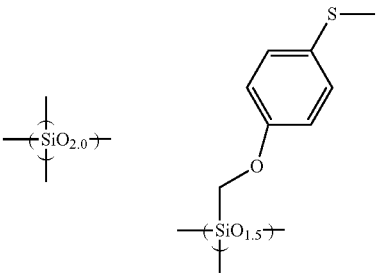

The above-mentioned hydrolysis-condensation products (polyorganosiloxane) of the hydrolyzable silanes each have a weight-average molecular weight of 1,000 to 1,000,000, or 1,000 to 100,000. The molecular weights of these hydrolysis-condensation products are obtained by GPC analysis in terms of polystyrene.

The GPC measurement can be performed under conditions, for example, using a GPC apparatus (the trade name HLC-8220GPC, manufactured by Tosoh Corporation), GPC columns (the trade name Shodex KF803L, KF802, and KF801, manufactured by Showa Denko K.K.), a column temperature of 40° C., tetrahydrofuran as an eluent (an elution solvent), a flow amount (a flow rate) of 1.0 ml/min, and polystyrene (manufactured by Showa Denko K.K.) as a standard sample.

For the hydrolysis of alkoxysilyl group, acyloxysilyl group, or halogenated silyl group, 0.5 mol to 100 mol, preferably 1 mol to 10 mol of water is used per mol of the hydrolysable group.

Furthermore, 0.001 mol to 10 mol, preferably 0.001 mol to 1 mol of a hydrolysis catalyst, may be used per mol of the hydrolysable group.

The reaction temperature at the time of hydrolysis and condensation is normally 20° C. to 80° C.

The hydrolysis may be either completely or partially performed. That is, a hydrolysis product and a monomer may remain in a hydrolysis-condensation product. A catalyst may be used for the hydrolysis and condensation.

Examples of the hydrolysis catalyst include a metal chelate compound, an organic acid, an inorganic acid, an organic base, and an inorganic base.

Examples of the metal chelate compound serving as the hydrolysis catalyst include: titanium chelate compounds, such as triethoxy mono(acetylacetonato)titanium, tri-n-propoxy mono(acetylacetonato)titanium, tri-i-propoxy mono(acetylacetonato)titanium, tri-n-butoxy mono(acetylacetonato)titanium, tri-sec-butoxy mono(acetylacetonato)titanium, tri-t-butoxy mono(acetylacetonato)titanium, diethoxy bis(acetylacetonato)titanium, di-n-propoxy bis(acetylacetonato)titanium, di-i-propoxy bis(acetylacetonato)titanium, di-n-butoxy bis(acetylacetonato)titanium, di-sec-butoxy bis(acetylacetonato)titanium, di-t-butoxy bis(acetylacetonato)titanium, monoethoxy tris(acetylacetonato)titanium, mono-n-propoxy tris(acetylacetonato)titanium, mono-i-propoxy tris(acetylacetonato)titanium, mono-n-butoxy tris(acetylacetonato)titanium, mono-sec-butoxy tris(acetylacetonato)titanium, mono-t-butoxy tris(acetylacetonato)titanium, tetrakis(acetylacetonato)titanium, triethoxy mono(ethylacetoacetate)titanium, tri-n-propoxy mono(ethylacetoacetate)titanium, tri-i-propoxy mono(ethylacetoacetate)titanium, tri-n-butoxy mono(ethylacetoacetate)titanium, tri-sec-butoxy mono(ethylacetoacetate)titanium, tri-t-butoxy mono(ethylacetoacetate)titanium, diethoxy bis(ethylacetoacetate)titanium, di-n-propoxy.bis (ethylacetoacetate)titanium, di-i-propoxy bis(ethylacetoacetate)titanium, di-n-butoxy bis(ethylacetoacetate)titanium, di-sec-butoxy bis(ethylacetoacetate)titanium, di-t-butoxy bis(ethylacetoacetate)titanium, monoethoxy tris(ethylacetoacetate)titanium, mono-n-propoxy tris(ethylacetoacetate) titanium, mono-i-propoxy tris(ethylacetoacetate)titanium, mono-n-butoxy tris(ethylacetoacetate)titanium, mono-sec-butoxy tris(ethylacetoacetate)titanium, mono-t-butoxy tris (ethylacetoacetate)titanium, tetrakis(ethylacetoacetate)titanium, mono(acetylacetonato)tris(ethylacetoacetate) titanium, bis(acetylacetonato)bis(ethylacetoacetate) titanium, and tris(acetylacetonato)mono(ethylacetoacetate) titanium; zirconium chelate compounds, such as triethoxy mono(acetylacetonato)zirconium, tri-n-propoxy mono (acetylacetonato)zirconium, tri-i-propoxy mono(acetylacetonato)zirconium, tri-n-butoxy mono(acetylacetonato)zirconium, tri-sec-butoxy mono(acetylacetonato)zirconium, tri-t-butoxy mono(acetylacetonato)zirconium, diethoxy bis (acetylacetonato)zirconium, di-n-propoxy bis(acetylacetonato)zirconium, di-i-propoxy bis(acetylacetonato)zirconium, di-n-butoxy bis(acetylacetonato)zirconium, di-sec-butoxy bis(acetylacetonato)zirconium, di-t-butoxy bis (acetylacetonato)zirconium, monoethoxy tris (acetylacetonato)zirconium, mono-n-propoxy tris (acetylacetonato)zirconium, mono-i-propoxy tris (acetylacetonato)zirconium, mono-n-butoxy tris (acetylacetonato)zirconium, mono-sec-butoxy tris (acetylacetonato)zirconium, mono-t-butoxy tris (acetylacetonato)zirconium, tetrakis(acetylacetonato) zirconium, triethoxy mono(ethylacetoacetate)zirconium, tri-n-propoxy mono(ethylacetoacetate)zirconium, tri-i-propoxy mono(ethylacetoacetate)zirconium, tri-n-butoxy mono (ethylacetoacetate)zirconium, tri-sec-butoxy mono(ethylacetoacetate)zirconium, tri-t-butoxy mono(ethylacetoacetate) zirconium, diethoxy bis(ethylacetoacetate)zirconium, di-n-propoxy bis(ethylacetoacetate)zirconium, di-i-propoxy bis (ethylacetoacetate)zirconium, di-n-butoxy bis (ethylacetoacetate)zirconium, di-sec-butoxy bis (ethylacetoacetate)zirconium, di-t-butoxy bis (ethylacetoacetate)zirconium, monoethoxy tris (ethylacetoacetate)zirconium, mono-n-propoxy tris (ethylacetoacetate)zirconium, mono-i-propoxy tris (ethylacetoacetate)zirconium, mono-n-butoxy tris (ethylacetoacetate)zirconium, mono-sec-butoxy tris (ethylacetoacetate)zirconium, mono-t-butoxy tris (ethylacetoacetate)zirconium, tetrakis(ethylacetoacetate) zirconium, mono(acetylacetonato)tris(ethylacetoacetate) zirconium, bis(acetylacetonato)bis(ethylacetoacetate) zirconium, and tris(acetylacetonato)mono (ethylacetoacetate)zirconium; and aluminum chelate compounds, such as tris(acetylacetonato)aluminum and tris (ethylacetoacetate)aluminum.

Examples of the organic acid serving as the hydrolysis catalyst include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid.

Examples of the inorganic acid serving as the hydrolysis catalyst include hydrochloric acid, nitric acid, sulfuric acid, hydrofluoric acid, and phosphoric acid.

Examples of the organic base serving as the hydrolysis catalyst include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononane, diazabicycloundecene, and tetramethylammonium hydroxide. Examples of the inorganic base include ammonia, sodium hydroxide, potassium hydroxide, barium hydroxide, and calcium hydroxide. Among these catalysts, the metal chelate compounds, the organic acids, and the inorganic acids are preferable, and these catalysts may be used alone or in combination of two or more kinds thereof.

Examples of the organic solvent used for the hydrolysis include: aliphatic hydrocarbon-based solvents, such as n-pentane, i-pentane, n-hexane, i-hexane, n-heptane, i-heptane, 2,2,4-trimethylpentane, n-octane, i-octane, cyclohexane, and methylcyclohexane; aromatic hydrocarbon-based solvents, such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amylnaphthalene, and trimethylbenzene; monohydric alcohol-based solvents, such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol, and cresol; polyhydric alcohol-based solvents, such as ethylene glycol, propylene glycol, 1,3-butylene glycol, pentanediol-2,4,2-methylpentanediol-2,4, hexanediol-2,5, heptanediol-2,4,2-ethylhexanediol-1,3, diethylene glycol, dipropylene glycol, triethylene glycol, tripropylene glycol, and glycerol; ketone-based solvents, such as acetone, methyl ethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethylnonanone, cyclohexanone, methylcyclohexanone, 2,4-pentanedione, acetonylacetone, diacetone alcohol, acetophenone, and fenchone; ether-based solvents, such as ethyl ether, i-propyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxytriglycol, tetraethylene glycol di-n-butyl ether, propylene glycol monomethyl ether, propylene glycol monoethyl ether, propylene glycol monopropyl ether, propylene glycol monobutyl ether, propylene glycol monomethyl ether acetate, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester-based solvents, such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents, such as N-methylformamide, N,N-dimethylformamide, N,N-diethylformamide, acetamide, N-methylacetamide, N,N-dimethylacetamide, N-methylpropionamide, N-methylpyrrolidone (NMP); and sulfur-containing solvents, such as dimethyl sulfide, diethyl sulfide, thiophene, tetrahydrothiophene, dimethyl sulfoxide, sulfolane, and 1,3-propanesultone. These solvents may be used alone or in combination of two or more kinds thereof.

In particular, ketone-based solvents, such as acetone, methyl ethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethylnonanone, cyclohexanone, methylcyclohexanone, 2,4-pentanedione, acetonylacetone, diacetone alcohol, acetophenone, and fenchone, are preferable in terms of the preservation stability of the solutions.

Furthermore, bisphenol S or a bisphenol S derivative may be added as an additive. The amount of bisphenol S or a bisphenol S derivative added is 0.01 part by mass to 20 parts by mass, 0.01 part by mass to 10 parts by mass, or 0.01 part by mass to 5 parts by mass with respect to 100 parts by mass of polyorganosiloxane.

Preferable examples of the bisphenol S and the bisphenol S derivative are as follows.

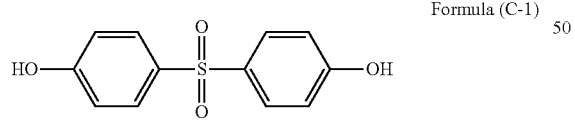

Formula (C-1)

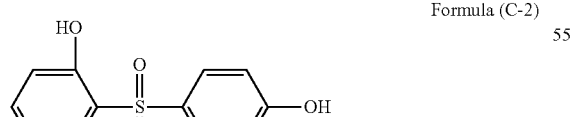

Formula (C-2)

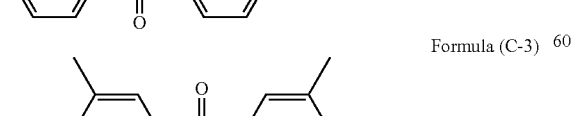

Formula (C-3)

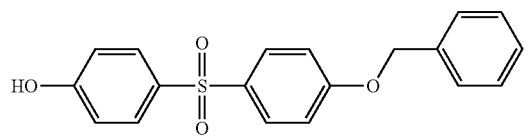

Formula (C-4)

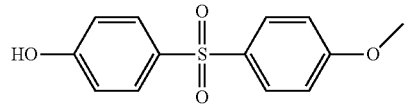

Formula (C-5)

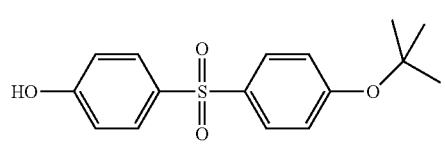

Formula (C-6)

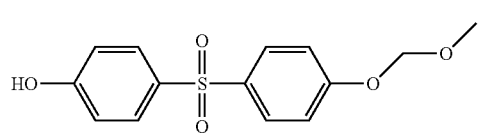

Formula (C-7)

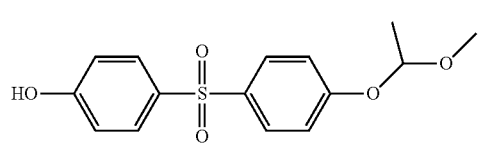

Formula (C-8)

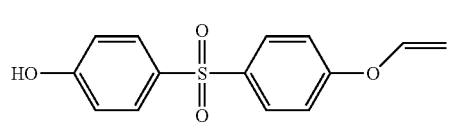

Formula (C-9)

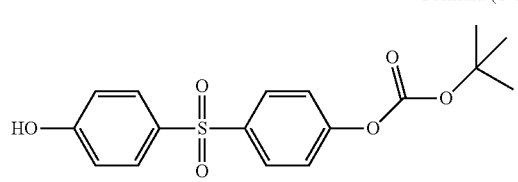

Formula (C-10)

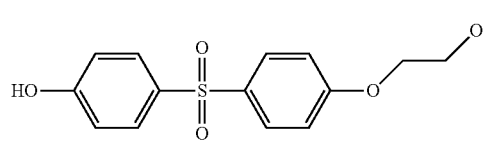

Formula (C-11)

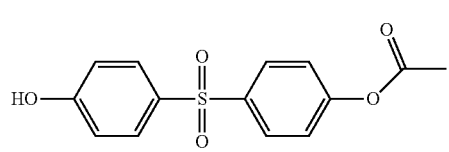

Formula (C-12)

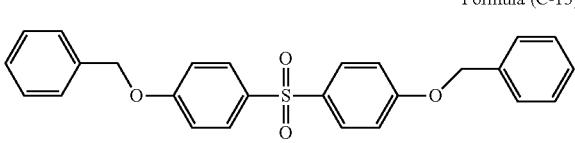

Formula (C-13)

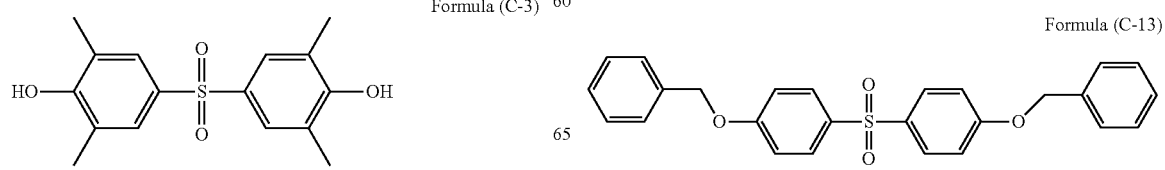

Formula (C-14)
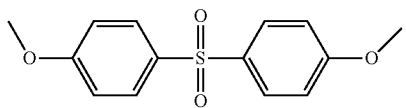

Formula (C-15)
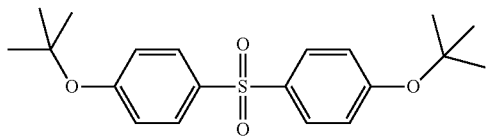

Formula (C-16)
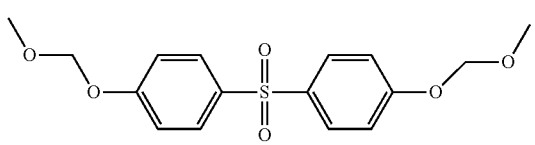

Formula (C-17)
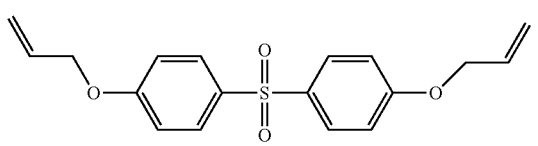

Formula (C-18)
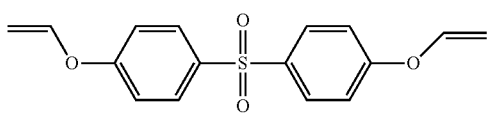

Formula (C-19)
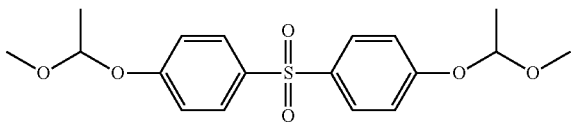

Formula (C-20)
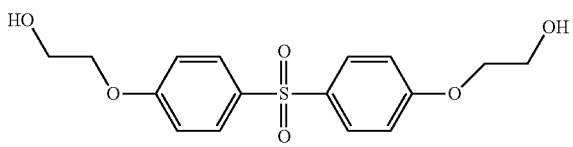

Formula (C-21)
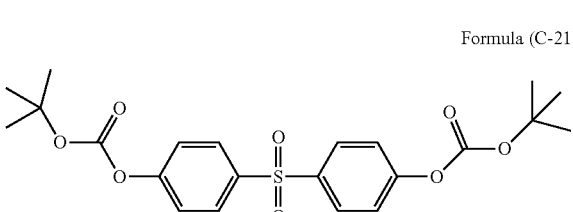

Formula (C-22)
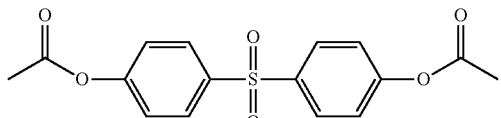

Formula (C-23)
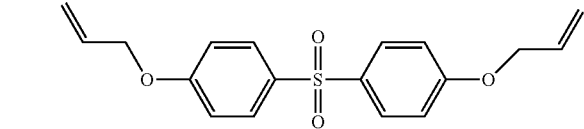

The resist underlayer film-forming composition of the present invention may include a curing catalyst. The curing catalyst acts as a curing catalyst when a coating film containing polyorganosiloxane formed from a hydrolysis-condensation product is heated and cured.

As the curing catalyst, ammonium salts, phosphines, phosphonium salts, and sulfonium salts may be used.

Examples of the ammonium salts include: a quaternary ammonium salt having a structure of Formula (D-1):

Formula (D-1)
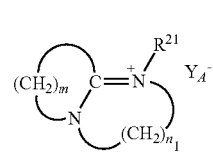

(where m is an integer of 2 to 11; $n_1$ is an integer of 2 to 3; $R^{21}$ is an alkyl group or an aryl group; and $Y_A^-$ is an anion);

a quaternary ammonium salt having a structure of Formula (D-2):

$$R^{22}R^{23}R^{24}R^{25}N^+Y_A^- \qquad \text{Formula (D-2)}$$

(where each of $R^{22}$, $R^{23}$, $R^{24}$, and $R^{25}$ is an alkyl group or an aryl group; N is a nitrogen atom; $Y_A^-$ is an anion; and each of $R^{22}$, $R^{23}$, $R^{24}$, and $R^{25}$ is bonded to the nitrogen atom through a C—N bond);

a quaternary ammonium salt having a structure of Formula (D-3):

Formula (D-3)
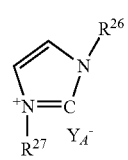

(where each of $R^{26}$ and $R^{27}$ is an alkyl group or an aryl group; and $Y_A^-$ is an anion);

a quaternary ammonium salt having a structure of Formula (D-4):

Formula (D-4)
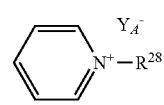

(where $R^{28}$ is an alkyl group or an aryl group; and $Y_A^-$ is an anion);

a quaternary ammonium salt having a structure of Formula (D-5):

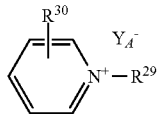

Formula (D-5)

(where each of $R^{29}$ and $R^{30}$ is an alkyl group or an aryl group; and $Y_A^-$ is an anion); and a tertiary ammonium salt having a structure of Formula (D-6):

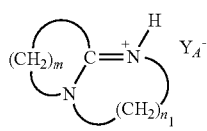

Formula (D-6)

(where m is an integer of 2 to 11; $n_1$ is an integer of 2 to 3; H is a hydrogen atom; and $Y_A^-$ is an anion).

Examples of the phosphonium salts include a quaternary phosphonium salt of Formula (D-7):

$$R^{31}R^{32}R^{33}R^{34}P^+Y_A^- \qquad \text{Formula (D-7)}$$

(where each of $R^{31}$, $R^{32}$, $R^{33}$, and $R^{34}$ is an alkyl group or an aryl group; P is a phosphorus atom; $Y_A^-$ is an anion; and each of $R^{31}$, $R^{32}$, $R^{33}$, and $R^{34}$ is bonded to the phosphorus atom through a C—P bond).

Examples of the sulfonium salts include a tertiary sulfonium salt of Formula (D-8):

$$R^{35}R^{36}R^{37}S^+Y_A^- \qquad \text{Formula (D-8)}$$

(where each of $R^{35}$, $R^{36}$, and $R^{37}$ is an alkyl group or an aryl group; S is a sulfur atom; $Y_A^-$ is an anion; and each of $R^{35}$, $R^{36}$, and $R^{37}$ is bonded to the sulfur atom through a C—S bond).

The compound of Formula (D-1) above is a quaternary ammonium salt derived from an amine, and, in Formula (D-1), m is an integer of 2 to 11 and $n_1$ is an integer of 2 to 3. $R^{21}$ of this quaternary ammonium salt is a $C_{1-18}$, preferably $C_{2-10}$ alkyl or aryl group. Examples of $R^{21}$ include linear alkyl groups, such as ethyl, propyl and butyl groups, benzyl group, cyclohexyl group, cyclohexylmethyl group, and dicyclopentadienyl group. Examples of the anion $(Y_A^-)$ include: halide ions, such as chloride ion (Cl$^-$), bromide ion (Br$^-$), and iodide ion (I$^-$); and acid groups, such as carboxylate (—COO$^-$), sulfonato (-SO$_3^-$), and alcoholate (-O$^-$).

The compound of Formula (D-2) above is a quaternary ammonium salt having a structure of $R^{22}R^{23}R^{24}R^{25}N^+Y_A^-$. Each of $R^{22}$, $R^{23}$, $R^{24}$, and $R^{25}$ of this quaternary ammonium salt is a $C_{1-18}$ alkyl or aryl group, or a silane compound bonded to a silicon atom through a Si—C bond. Examples of the anion $(Y_A^-)$ include: halide ions, such as chloride ion (Cl$^-$), bromide ion (Br$^-$), and iodide ion (I$^-$); and acid groups, such as carboxylate (—COO$^-$), sulfonato (—SO$_3^-$), and alcoholate (—O$^-$). This quaternary ammonium salt is commercially available, and examples of this quaternary ammonium salt include tetramethylammonium acetate, tetrabutylammonium acetate, benzyltriethylammonium chloride, benzyltriethylammonium bromide, methyltrioctylammonium chloride, benzyltributylammonium chloride, and benzyltrimethylammonium chloride.

The compound of Formula (D-3) is a quarternary ammonium salt derived from a 1-substituted imidazole, and, in Formula (D-3), each of $R^{26}$ and $R^{27}$ is a $C_{1-18}$ alkyl or aryl group, and the sum total of the number of carbon atoms of $R^{26}$ and $R^{27}$ is preferably 7 or more. Examples of $R^{26}$ include methyl group, ethyl group, propyl group, phenyl group, and benzyl group. Examples of $R^{27}$ include benzyl group, octyl group, and octadecyl group. Examples of the anion $(Y_A^-)$ include: halide ions, such as chloride ion (Cl$^-$), bromide ion (Br$^-$), and iodide ion (I$^-$); and acid groups, such as carboxylate (—COO$^-$), sulfonato (—SO$_3^-$), and alcoholate (—O$^-$). Although this compound is commercially available, the compound can be produced, for example, by a reaction between an imidazole-based compound, such as 1-methylimidazole or 1-benzylimidazole, and an alkyl halide or an aryl halide, such as benzyl bromide or methyl bromide.

The compound of Formula (D-4) above is a quarternary ammonium salt derived from pyridine, and in Formula (D-4), $R^{28}$ is a $C_{1-18}$, preferably $C_{4-18}$ alkyl or aryl group, and examples of $R^{28}$ include butyl group, octyl group, benzyl group, and lauryl group. Examples of the anion $(Y_A^-)$ include: halide ions, such as chloride ion (Cl$^-$), bromide ion (Br$^-$), and iodide ion (I$^-$); and acid groups, such as carboxylate (—COO$^-$), sulfonato (—SO$_3^-$), and alcoholate (—O$^-$). Although this compound is commercially available, the compound can be produced, for example, by a reaction between pyridine and an alkyl halide or an aryl halide, such as lauryl chloride, benzyl chloride, benzyl bromide, methyl bromide, or octyl bromide. Examples of this compound include N-laurylpyridinium chloride and N-benzylpyridinium bromide.

The compound of Formula (D-5) above is a quarternary ammonium salt derived from a substituted pyridine, represented by picoline, and in Formula (D-5), $R^{29}$ is a $C_{1-18}$, preferably $C_{4-18}$ alkyl or aryl group, and examples of $R^{29}$ include methyl group, octyl group, lauryl group, and benzyl group. $R^{30}$ is a $C_{1-18}$ alkyl or aryl group, and, when the compound is, for example, a quarternary ammonium salt derived from picoline, $R^{30}$ is a methyl group. Examples of the anion $(Y_A^-)$ include: halide ions, such as chloride ion (Cl$^-$), bromide ion (Br$^-$), and iodide ion (I$^-$); and acid groups, such as carboxylate (—COO$^-$), sulfonato (—SO$_3^-$), and alcoholate (—O$^-$). Although this compound is commercially available, the compound can be produced, for example, by a reaction between a substituted pyridine, such as picoline, and an alkyl halide or an aryl halide, such as methyl bromide, octyl bromide, lauryl chloride, benzyl chloride, or benzyl bromide. Examples of this compound include N-benzylpicolinium chloride, N-benzylpicolinium bromide, and N-laurylpicolinium chloride.

The compound of Formula (D-6) is a tertiary ammonium salt derived from an amine, and, in Formula (D-6), m is an integer of 2 to 11 and $n_1$ is an integer of 2 to 3. Examples of the anion $(Y_A^-)$ include: halide ions, such as chloride ion (Cl$^-$), bromide ion (Br$^-$), and iodide ion (I$^-$); and acid groups, such as carboxylate (—COO$^-$), sulfonato (—SO$_3^-$), and alcoholate (—O$^-$). The compound can be produced, for example, by a reaction between an amine and a weak acid, such as carboxylic acid or phenol. Examples of the carboxylic acid include formic acid and acetic acid. In the case of using formic acid, the anion $(Y_A^-)$ is (HCOO$^-$). In the case of using acetic acid, the anion $(Y_A^-)$ is (CH$_3$COO$^-$). Alternatively, in the case of using phenol, the anion $(Y_A^-)$ is (C$_6$H$_5$O$^-$).

The compound of Formula (D-7) above is a quarternary phosphonium salt having a structure of $R^{31}R^{32}R^{33}R^{34}P^+Y_A^-$. Each of $R^{31}$, $R^{32}$, $R^{33}$, and $R^{34}$ is a $C_{1-18}$ alkyl or aryl group, or a silane compound bonded to a silicon atom through a Si—C bond. Three of the four substituents, $R^{31}$ to $R^{34}$, are preferably a phenyl group or a substituted phenyl group, and examples of the substituents include phenyl group and tolyl group. The remaining one substituent is a $C_{1-18}$ alkyl or aryl group, or a silane compound bonded to a silicon atom through a Si—C bond. Examples of the anion $(Y_A^-)$ include: halide ions, such as chloride ion ($Cl^-$), bromide ion ($Br^-$), and iodide ion Up; and acid groups, such as carboxylate (—$COO^-$), sulfonato (—$SO_3^-$), and alcoholate (—$O^-$). This compound is commercially available, and examples of the compound include: tetraalkylphosphonium halides, such as tetra-n-butylphosphonium halides and tetra-n-propylphosphonium halides; trialkylbenzylphosphonium halides, such as triethylbenzylphosphonium halides; triphenylmonoalkylphosphonium halides, such as triphenylmethylphosphonium halides and triphenylethylphosphonium halides; triphenylbenzylphosphonium halides; tetraphenylphosphonium halides; tritolylmonoarylphosphonium halides; and tritolylmonoalkylphosphonium halides (in which a halogen atom is a chlorine atom or a bromine atom). In particular, triphenylmonoalkylphosphonium halides, such as triphenylmethylphosphonium halides and triphenylethylphosphonium halides; triphenylmonoarylphosphonium halides, such as triphenylbenzylphosphonium halides; tritolylmonoarylphosphonium halides, such as tritolylmonophenylphosphonium halides; and tritolylmonoalkylphosphonium halides, such as tritolylmonomethylphosphonium halides (in which a halogen atom is a chlorine atom or a bromine atom), are preferable.

Examples of the phosphines include: primary phosphines, such as methylphosphine, ethylphosphine, propylphosphine, isopropylphosphine, isobutylphosphine, and phenylphosphine; secondary phosphines, such as dimethylphosphine, diethylphosphine, diisopropylphosphine, diisoamylphosphine, and diphenylphosphine; and tertiary phosphines, such as trimethylphosphine, triethylphosphine, triphenylphosphine, methyldiphenylphosphine, and dimethylphenylphosphine.

The compound of Formula (D-8) above is a tertiary sulfonium salt having a structure of $R^{35}R^{36}R^{37}S^+Y_A^-$. Each of $R^{35}$, $R^{36}$, and $R^{37}$ is a $C_{1-18}$ alkyl or aryl group, or a silane compound bonded to a silicon atom through a Si—C bond. Three of the four substituents, $R^{35}$ to $R^{37}$, are preferably a phenyl group or a substituted phenyl group, and examples of the substituents include phenyl group and tolyl group. The remaining one substituent is a $C_{1-18}$ alkyl or aryl group. Examples of the anion $(Y_A^-)$ include: halide ions, such as chloride ion ($Cl^-$), bromide ion ($Br^-$), and iodide ion ($I^-$); and acid groups, such as carboxylate (—$COO^-$), sulfonato (—$SO_3^-$), alcoholate (—$O^-$), maleic acid anion, and nitric acid anion.

This compound is commercially available, and examples of the compound include: tetraalkylsulfonium halides, such as tri-n-butylsulfonium halides and tri-n-propylsulfonium halides; trialkylbenzylsulfonium halides, such as diethylbenzylsulfonium halides; diphenylmonoalkylsulfonium halides, such as diphenylmethylsulfonium halides and diphenylethylsulfonium halides; tetraalkylphosphonium carboxylates, such as triphenyl sulfonium halides (in which a halogen atom is a chlorine atom or the bromine atom), tri-n-butylsulfonium carboxylate, and tri-n-propylsulfonium carboxylate; trialkylbenzylsulfonium carboxylates, such as diethylbenzylsulfonium carboxylate; diphenylmonoalkylsulfonium carboxylates, such as diphenylmethylsulfonium carboxylate and diphenylethylsulfonium carboxylate; and triphenylsulfonium carboxylate. Triphenylsulfonium halides and triphenylsulfonium carboxylate may be preferably used.

Furthermore, in the present invention, a nitrogen-containing silane compound may be added as a curing catalyst. Examples of the nitrogen-containing silane compound include an imidazole-ring-containing silane compound, such as N-(3-triethoxysilylpropyl)-4,5-dihydroimidazole.

The amount of the curing catalyst added is 0.01 part by mass to 10 parts by mass, 0.01 part by mass to 5 parts by mass, or 0.01 part by mass to 3 parts by mass, with respect to 100 parts by mass of polyorganosiloxane.

A hydrolyzable silane is hydrolyzed and condensed using a catalyst in a solvent, and alcohol as a by-product, the used hydrolysis catalyst, and water can be removed from an obtained hydrolysis-condensation product (a polymer) at the same time, for example, by distillation under reduced pressure. Furthermore, an acid catalyst or a base catalyst used in the hydrolysis can be removed by neutralization or ion exchange. In the resist underlayer film-forming composition for lithography of the present invention, an organic acid, water, and alcohol, or a combination thereof may be added for the purpose of stabilizing the resist underlayer film-forming composition including the hydrolysis-condensation product.

Examples of the organic acid include oxalic acid, malonic acid, methylmalonic acid, succinic acid, maleic acid, malic acid, tartaric acid, phthalic acid, citric acid, glutaric acid, citric acid, lactic acid, and salicylic acid. Among these, oxalic acid, maleic acid and the like are preferable. The amount of the organic acid added is 0.1 part by mass to 5.0 parts by mass with respect to 100 parts by mass of a condensation product (polyorganosiloxane). Furthermore, pure water, ultrapure water, and ion exchange water may be used as the water to be added, and the amount of the water added may be 1 part by mass to 20 parts by mass with respect to 100 parts by mass of the resist underlayer film-forming composition.

As the alcohol to be added, alcohol that easily vaporizes with heating after the application is preferable, and examples of this alcohol include methanol, ethanol, propanol, isopropanol (2-propanol), and butanol. The amount of the alcohol added may be 1 part by mass to 20 parts by mass with respect to 100 parts by mass of the resist underlayer film-forming composition.

Besides the above-mentioned components, the underlayer film-forming composition for lithography of the present invention may include an organic polymer compound, a photoacid generator, and a surfactant, as necessary.

The use of an organic polymer compound allows the adjustment of the dry etching rate (the amount of reduction in film thickness per unit time), the attenuation coefficient, the refractive index and the like of a resist underlayer film formed from the underlayer film-forming composition for lithography of the present invention.

The organic polymer compound is not limited to a particular compound, and various kinds of organic polymers may be used. For example, polycondensation polymers and addition polymerization polymers may be used. Examples of the addition polymerization polymers and polycondensation polymers to be used include polyesters, polystyrenes, polyimides, acrylic polymers, methacrylic polymers, polyvinyl ethers, phenol novolacs, naphthol novolacs, polyethers, polyamides, and polycarbonates. Organic polymers having aromatic ring structures acting as an absorption site, such as a benzene ring, a naphthalene ring, an anthracene ring, a triazine ring, a quinoline ring, and a quinoxaline ring, are preferably used.

Examples of the organic polymer compound include: addition polymerization polymers including, as a structural unit thereof, addition polymerizable monomers, such as benzyl acrylate, benzyl methacrylate, phenyl acrylate, naphthyl acrylate, anthryl methacrylate, anthrylmethyl methacrylate, styrene, hydroxystyrene, benzyl vinyl ether, and N-phenylmaleimide; and polycondensation polymers, such as phenol novolacs and naphthol novolacs.

In the case where an addition polymerization polymer is used as the organic polymer compound, the polymer compound may be a homopolymer or a copolymer. For the manufacture of the addition polymerization polymer, an addition polymerizable monomer is used. Examples of the addition polymerizable monomer include acrylic acid, methacrylic acid, an acrylic ester compound, a methacrylic ester compound, an acrylamide compound, a methacrylamide compound, a vinyl compound, a styrene compound, a maleimide compound, a maleic anhydride, and acrylonitrile.

Examples of the acrylic ester compound include methyl acrylate, ethyl acrylate, normal hexyl acrylate, isopropyl acrylate, cyclohexyl acrylate, benzyl acrylate, phenyl acrylate, anthrylmethyl acrylate, 2-hydroxyethyl acrylate, 3-chloro-2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, tetrahydrofurfuryl acrylate, 2-methyl-2-adamantyl acrylate, 5-acryloyloxy-6-hydroxynorbornene-2-carboxylic-6-lactone, 3-acryloxypropyltriethoxysilane, and glycidyl acrylate.

Examples of the methacrylic ester compound include methyl methacrylate, ethyl methacrylate, normal hexyl methacrylate, isopropyl methacrylate, cyclohexyl methacrylate, benzyl methacrylate, phenyl methacrylate, anthrylmethyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, tetrahydrofurfuryl methacrylate, 2-methyl-2-adamantyl methacrylate, 5-methacryloyloxy-6-hydroxynorbornene-2-carboxylic-6-lactone, 3-methacryloxypropyltriethoxysilane, glycidyl methacrylate, 2-phenylethyl methacrylate, hydroxyphenyl methacrylate, and bromophenyl methacrylate.

Examples of the acrylamide compound include acrylamide, N-methylacrylamide, N-ethylacrylamide, N-benzylacrylamide, N-phenylacrylamide, N,N-dimethylacrylamide, and N-anthrylacrylamide.

Examples of the methacrylamide compound include methacrylamide, N-methylmethacrylamide, N-ethylmethacrylamide, N-benzylmethacrylamide, N-phenylmethacrylamide, N,N-dimethylmethacrylamide, and N-anthrylacrylamide.

Examples of the vinyl compound include vinyl alcohol, 2-hydroxyethyl vinyl ether, methyl vinyl ether, ethyl vinyl ether, benzyl vinyl ether, vinylacetic acid, vinyl trimethoxy silane, 2-chloroethyl vinyl ether, 2-methoxyethyl vinyl ether, vinyl naphthalene, and vinyl anthracene.

Examples of the styrene compound include styrene, hydroxystyrene, chlorostyrene, bromostyrene, methoxystyrene, cyanostyrene, and acetylstyrene.

Examples of the maleimide compound include maleimide, N-methylmaleimide, N-phenylmaleimide, N-cyclohexylmaleimide, N-benzylmaleimide, and N-hydroxyethylmaleimide.

In the case of using a polycondensation polymer as the polymer, examples of the polymer include a polycondensation polymer of a glycol compound and a dicarboxylic acid compound. Examples of the glycol compound include diethylene glycol, hexamethylene glycol, and butylene glycol. Examples of the dicarboxylic acid compound include succinic acid, adipic acid, terephthalic acid, and maleic anhydride. Examples of the polycondensation polymer include polyesters, polyamides, and polyimides, such as poly(pyromellitic imide), poly(p-phenyleneterephthalamide), poly(butylene terephthalate), and poly(ethylene terephthalate).

In the case where the organic polymer compound has a hydroxy group, this hydroxy group can cause a crosslinking reaction with a polyorganosiloxane. As the organic polymer compound, a polymer compound having a weight-average molecular weight of, for example, 1,000 to 1,000,000, 3,000 to 300,000, 5,000 to 200,000, or 10,000 to 100,000 may be used.

The organic polymer compounds may be used alone, or in combination of two or more kinds thereof.

In the case of using the organic polymer compound, the amount of the organic polymer compound is 1 part by mass to 200 parts by mass, 5 parts by mass to 100 parts by mass, 10 parts by mass to 50 parts by mass, or 20 parts by mass to 30 parts by mass with respect to 100 parts by mass of a polycondensate (polyorganosiloxane).

The resist underlayer film-forming composition of the present invention may include an acid generator. Examples of the acid generator include thermal acid generators and photoacid generators.

Photoacid generators generate an acid at the time of the light exposure of the resist. Accordingly, the acidity of an underlayer film can be adjusted. This is one method for adjusting the acidity of an underlayer film to the acidity of a resist serving as an upper layer. Furthermore, the adjustment of acidity of an underlayer film allows the pattern shape of a resist formed as the upper layer to be adjusted.

Examples of the photoacid generator included in the resist underlayer film-forming composition of the present invention include an onium salt compound, a sulfonimide compound, and a disulfonyldiazomethane compound.

Examples of the onium salt compound include: iodonium salt compounds, such as diphenyliodonium hexafluorophosphate, diphenyliodonium trifluoromethanesulfonate, diphenyliodonium nonafluoro normal butanesulfonate, diphenyliodonium perfluoro normal octanesulfonate, diphenyliodonium camphorsulfonate, bis(4-tert-butylphenyl)iodonium camphorsulfonate, and bis(4-tert-butylphenyl)iodonium trifluoromethanesulfonate; and sulfonium salt compounds, such as triphenylsulfonium hexafluoroantimonate, triphenylsulfonium nonafluoro normal butanesulfonate, triphenylsulfonium camphorsulfonate, and triphenylsulfonium trifluoromethanesulfonate.

Examples of the sulfonimide compound include N-(trifluoromethanesulfonyloxy)succinimide, N-(nonafluoro normal butane sulfonyloxy)succinimide, N-(camphorsulfonyloxy)succinimide, and N-(trifluoromethanesulfonyloxy)naphthalimide.

Examples of the disulfonyldiazomethane compound include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

The photoacid generators may be used alone, or in combination of two or more kinds thereof.

In the case of using the photoacid generator, the amount of the photoacid generator is 0.01 part by mass to 5 parts by mass, 0.1 part by mass to 3 parts by mass, or 0.5 part by mass to 1 part by mass, with respect to 100 parts by mass of a polycondensation product (polyorganosiloxane).

Surfactants effectively suppress the formation of pinholes, striations and the like when the resist underlayer film-forming composition for lithography of the present invention is applied to a substrate.

Examples of a surfactant included in the resist underlayer film-forming composition of the present invention include: nonionic surfactants, such as polyoxyethylene alkyl ethers including polyoxyethylene lauryl ethers, polyoxyethylene stearyl ethers, polyoxyethylene cetyl ethers, and polyoxyethylene oleyl ethers, polyoxyethylene alkylallyl ethers, including polyoxyethylene octylphenol ethers and polyoxyethylene nonylphenol ethers, polyoxyethylene-polyoxypropylene block copolymers, sorbitan fatty acid esters, including sorbitan monolaurates, sorbitan monopalmitates, sorbitan monostearates, sorbitan monooleates, sorbitan trioleates, and sorbitan tristearates, polyoxyethylene sorbitan fatty acid esters, including polyoxyethylene sorbitan monolaurates, polyoxyethylene sorbitan monopalmitates, polyoxyethylene sorbitan monostearates, polyoxyethylene sorbitan trioleates, and polyoxyethylene sorbitan tristearates; fluorine-based surfactants, such as the trade names EFTOP EF301, EF303, and EF352 (manufactured by Tohkem Products Corporation), the trade names MEGAFAC F171, F173, R-08, R-30, R-30N, and R-40LM (manufactured by DIC Corporation), Fluorad FC430 and FC431 (manufactured by Sumitomo 3M Limited), the trade name Asahi Guard AG710 and the trade names SURFLON S-382, SC101, SC102, SC103, SC104, SC105, and SC106 (manufactured by Asahi Glass Co., Ltd.); and an organosiloxane polymer KP341 (manufactured by Shin-Etsu Chemical Co., Ltd.). These surfactants may be used alone, or in combination of two or more kinds thereof. In the case of using the surfactant, the amount of the surfactant is 0.0001 part by mass to 5 parts by mass, 0.001 part by mass to 1 part by mass, or 0.01 part by mass to 1 part by mass with respect to 100 parts by mass of a polycondensation product (polyorganosiloxane).

Furthermore, to the resist underlayer film-forming composition of the present invention, a rheology controlling agent and an adhesion assistant may be added. A rheology controlling agent effectively improves the fluidity of the underlayer film-forming composition. An adhesion assistant effectively improves adhesion between a semiconductor substrate or a resist and an underlayer film.

As the solvent used for the resist underlayer film-forming composition of the present invention, a solvent capable of dissolving the above-mentioned solid contents may be used without particular limitations. Examples of the solvent include methylcellosolve acetate, ethylcellosolve acetate, propylene glycol, propylene glycol monomethyl ether, propylene glycol monoethyl ether, methyl isobutyl carbinol, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropinoate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol mooethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methylpropionate, methyl 3-methoxy-2-methylpropionate, methyl 2-hydroxy-3-methybutyrate, ethyl methoxyacetate, ethyl ethoxyacetate, methyl 3-methoxy propionate, ethyl 3-ethoxy propionate, ethyl 3-methoxy propionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, toluene, xylene, methyl ethyl ketone, methyl propyl ketone, methyl butyl ketone, 2-heptanone, 3-heptanone, 4-heptanone, cyclohexanone, N,N-dimethylformamide, N-methylacetamide, N,N-dimethylacetamide, N-methylpyrrolidone, 4-methyl-2-pentanol, and γ-butyrolactone. These solvents may be used alone, or in combination of two or more kinds thereof.

Hereinafter, the use of the resist underlayer film-forming composition of the present invention is described.

A resist underlayer film is formed by applying the resist underlayer film-forming composition of the present invention onto a substrate, or is formed by applying the resist underlayer film-forming composition onto a substrate via an organic underlayer film, and a resist film (for example, photoresist or electron resist) is formed on the resist underlayer film. Then, a resist pattern is formed by light exposure and development. Using the resist pattern, the resist underlayer film is dry-etched to perform the transfer of the pattern, and the substrate is processed using the pattern, or the organic underlayer film is etched to perform the transfer of the pattern and the substrate is processed using the organic underlayer film.

In the formation of a fine pattern, the film thickness of a resist tends to be made thinner for the purpose of preventing pattern collapse. Due to such a thinner resist film, the etching rate of dry etching for transferring a pattern to a film present under the resist film needs to be higher than that of dry etching of the upper layer film in order to perform the pattern transfer. In the present invention, a resist underlayer film (containing an inorganic silicon-based compound) of the present invention is coated on a substrate via an organic underlayer film or not via an organic underlayer film, and a resist film (an organic resist film) is coated thereon in this order. Depending on a selected etching gas, a film of an organic component and a film of an inorganic component considerably differ in dry etching rate. With the use of an oxygen-based gas, a film of an organic component is dry-etched at a higher rate. In contrast, with the use of a halogen-containing gas, a film of an inorganic component is dry-etched at a higher rate.

For example, a resist pattern is formed, then a resist underlayer film of the present invention present under a layer with the resist pattern is dry-etched using a halogen-containing gas to transfer the pattern to the resist underlayer film, and, using the pattern transferred to the resist underlayer film, a substrate is processed with a halogen-containing gas. Alternatively, using a resist underlayer film to which the pattern is transferred, an organic underlayer film under the resist underlayer film is dry-etched by an oxygen-based gas to transfer the pattern to the organic underlayer film, and, using the organic underlayer film to which the pattern is transferred, a substrate is processed with a halogen-containing gas.

Here, onto a substrate used for the manufacture of a semiconductor device (for example, a silicon wafer substrate, a silicon/silicon-dioxide coated substrate, a silicon nitride substrate, a glass substrate, an ITO substrate, a polyimide substrate, or a low dielectric constant material (low-k material) coated substrate), the resist underlayer film-forming composition of the present invention is applied by appropriate application means, such as a spinner and a coater, followed by baking to form a resist underlayer film. The baking is performed under the conditions appropriately selected from heating temperatures of 80° C. to 250° C. and heating duration of 0.3 minute to 60 minutes. The baking temperature is preferably 150° C. to 250° C., and the heating duration is preferably 0.5 minute to 2 minutes. Here, the thickness of the underlayer film formed is, for example, 10 nm to 1,000 nm, 20 nm to 500 nm, 50 nm to 300 nm, or 100 nm to 200 nm.

Next, a photoresist layer, for example, is formed on the resist underlayer film. The photoresist layer can be formed by a well-known process, that is, the application of a solution of a photoresist composition onto the underlayer film, followed by baking. The film thickness of the photoresist layer is, for example, 50 nm to 10,000 nm, 100 nm to 2,000 nm, or 200 nm to 1,000 nm.

In the present invention, an organic underlayer film can be formed on a substrate, the resist underlayer film of the present invention can then be formed on the organic underlayer film, and furthermore, a photoresist can be coated on the resist underlayer film. This allows the pattern width of the photoresist to be narrower, and accordingly, even when the photoresist is applied thinly for the purpose of preventing pattern collapse, substrate processing is made possible by selecting an appropriate etching gas. For example, the use of a fluorine-based gas as an etching gas, which results in a significantly high etching rate for a photoresist, allows the resist underlayer film of the present invention to be processed. In contrast, the use of an oxygen-based gas as an etching gas, which results in a significantly high etching rate for the resist underlayer film of the present invention, allows an organic underlayer film to be processed. Furthermore, the use of a fluorine-based gas as an etching gas, which results in a significantly high rate for the organic underlayer film, allows a substrate to be processed.

The photoresist formed on the resist underlayer film of the present invention is not limited to a particular one as long as the photoresist is sensitive to light used for exposure. Negative and positive photoresists may both be used. Examples of the photoresist include a positive photoresist formed of a novolac resin and a 1,2-naphthoquinone diazide sulfonic acid ester; a chemically amplified photoresist formed of a photoacid generator and a binder having a group that is decomposed by acid to increase an alkali dissolution rate; a chemically amplified photoresist formed of an alkali-soluble binder, a photoacid generator, and a low molecular weight compound that is decomposed by acid to increase an alkali dissolution rate of the photoresist; and a chemically amplified photoresist formed of a binder having a group that is decomposed by acid to increase an alkali dissolution rate, a low molecular weight compound that is decomposed by acid to increase an alkali dissolution rate of the photoresist, and a photoacid generator. Examples of the photoresists include the trade name APEX-E, manufactured by Shipley, the trade name PAR710, manufactured by Sumitomo Chemical Company, Limited, and the trade name SEPR430, manufactured by Shin-Etsu Chemical Co., Ltd. Furthermore, examples of the photoresists include fluorine-atom-containing polymer-based photoresists described in Proc. SPIE, Vol. 3999, 330-334 (2000), Proc. SPIE, Vol. 3999, 357-364 (2000), and Proc. SPIE, Vol. 3999, 365-374 (2000).

Next, light exposure is performed through a predetermined mask. For the light exposure, for example, a KrF excimer laser (with a wavelength of 248 nm), an ArF excimer laser (with a wavelength of 193 nm), or an F2 excimer laser (with a wavelength of 157 nm) can be used. After the light exposure, post exposure bake may be performed, if necessary. The post exposure bake is performed under the conditions appropriately selected from heating temperatures of 70° C. to 150° C. and heating duration of 0.3 minute to 10 minutes.

In the present invention, a resist for electron beam lithography or a resist for EUV lithography may be used as a resist in place of a photoresist. Positive and negative electron beam resists may both be used. Examples of the electron beam resists include a chemically amplified resist formed of an acid generator and a binder having a group that is decomposed by acid to change an alkali dissolution rate; a chemically amplified resist formed of an alkali-soluble binder, an acid generator, and a low molecular weight compound that is decomposed by acid to change an alkali dissolution rate of the resist; a chemically amplified resist formed of an acid generator, a binder having a group that is decomposed by acid to change an alkali dissolution rate, and a low molecular weight compound that is decomposed by acid to change an alkali dissolution rate; a non-chemically amplified resist formed of a binder having a group that is decomposed by an electron beam to change an alkali dissolution rate of the resist; and a non-chemically amplified resist formed of a binder having a portion that is cut by an electron beam to change an alkali dissolution rate. Also, in the cases of using these electron beam resists, a resist pattern can be formed using an electron beam as an irradiation source in the same manner as in the case of using a photoresist.

As the EUV resist, a methacrylate resin-based photoresist may be used.

Next, development is performed using a developing solution (for example, an alkaline developing solution). Thus, for example, in the case of using a positive photoresist, an exposed portion of the photoresist is removed to form a pattern of the photoresist.

Examples of the developing solution include alkaline developing solutions, such as: aqueous solutions of an alkali metal hydroxide, such as potassium hydroxide and sodium hydroxide; aqueous solutions of a quaternary ammonium hydroxide, such as tetramethyl ammonium hydroxide, tetraethyl ammonium hydroxide, and choline; and aqueous solutions of amine, such as ethanolamine, propylamine, and ethylenediamine. Furthermore, a surfactant or other substances may be added to these developing solutions. The development conditions are appropriately selected from temperatures of 5° C. to 50° C. and duration of 10 seconds to 600 seconds.

Furthermore, in the present invention, an organic solvent may be used as a developing solution. After the light exposure, development is performed using a developing solution (a solvent). Thus, for example, in the case of using a positive photoresist, an unexposed portion of the photoresist is removed to form a pattern of the photoresist.

Examples of the developing solution include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxy butyl acetate, 3-methoxybutyl acetate, 4-methoxybutyl acetate, 3-methyl-3-methoxybutyl acetate, 3-ethyl-3-methoxybutyl acetate, propylene glycol monoethyl ether acetate, propylene glycol monopropyl ether acetate, 2-ethoxy butyl acetate, 4-ethoxy butyl acetate, 4-propoxy butyl acetate, 2-methoxy pentyl acetate, 3-methoxy pentyl acetate, 4-methoxy pentyl acetate, 2-methyl-3-methoxy pentyl acetate, 3-methyl-3-methoxy pentyl acetate, 3-methyl-4-methoxy pentyl acetate, 4-methyl-4-methoxy pentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxy propionate, ethyl-3-methoxy propionate, ethyl-3-ethoxy propionate, and propyl-3-methoxy propionate. Furthermore, a surfactant or other substances may be added to these developing solutions. The development conditions are appropriately selected from temperatures of 5° C. to 50° C. and duration of 10 seconds to 600 seconds.

Then, using the thus-formed pattern of the photoresist (upper layer) as a protective film, the resist underlayer film (intermediate layer) of the present invention is removed. Subsequently, using a film formed of the patterned photoresist and the patterned resist underlayer film (intermediate layer) of the present invention as protective films, an organic underlayer film (lower layer) is removed. Finally, using the patterned resist underlayer film (intermediate layer) of the present invention and the patterned organic underlayer film (lower layer) as protective films, a semiconductor substrate is processed.

First, a photoresist-removed portion of the resist underlayer film (intermediate layer) of the present invention is removed by dry etching to make a semiconductor substrate exposed. For the dry etching of the resist underlayer film of the present invention, gases, such as tetrafluoromethane ($CF_4$), parfluorocyclobutane ($C_4F_8$), parfluoropropane ($C_3F_8$), trifluoromethane, carbon monoxide, argon, oxygen, nitrogen, sulfur hexafluoride, difluoromethane, nitrogen trifluoride and chlorine trifluoride, chlorine, trichloroborane, and dichloroborane may be used. For the dry etching of the resist underlayer film, a halogen-based gas is preferably used. With dry etching using a halogen-based gas, a photoresist formed of an organic substance is basically hard to remove. In contrast, the resist underlayer film of the present invention that contains many silicon atoms is promptly removed by a halogen-based gas. Thus, a reduction in the film thickness of the photoresist that is associated with the dry etching of the resist underlayer film can be suppressed. As a result, a thinner photoresist film can be used. The dry etching of the resist underlayer film is preferably performed using a fluorine-based gas. Examples of the fluorine-based gas include tetrafluoromethane ($CF_4$), parfluorocyclobutane ($C_4F_8$), parfluoropropane ($C_3F_8$), trifluoromethane, and difluoromethane ($CH_2F_2$).

After that, using a film formed of the patterned photoresist and the patterned resist underlayer film of the present invention as protective films, the organic underlayer film is removed. The dry etching of the organic underlayer film (lower layer) is preferably performed using an oxygen-based gas. This is because the resist underlayer film of the present invention that contains many silicon atoms is hard to remove by dry etching using an oxygen-based gas.

Finally, a semiconductor substrate is processed. The processing of the semiconductor substrate is preferably performed by dry etching using a fluorine-based gas.

Examples of the fluorine-based gas include tetrafluoromethane ($CF_4$), parfluorocyclobutane ($C_4F_8$), parfluoropropane ($C_3F_8$), trifluoromethane, and difluoromethane ($CH_2F_2$).

Furthermore, on the resist underlayer film of the present invention, an organic anti-reflective coating may be formed before the formation of a photoresist. An anti-reflective coating composition used for the anti-reflective coating is not limited to a particular one, and may be appropriately selected from various anti-reflective coating compositions that have been commonly used for lithography process. Furthermore, the anti-reflective coating may be formed using a common method, for example, application with a spinner and a coater and baking.

The substrate to which the resist underlayer film-forming composition of the present invention is applied may have an organic or inorganic anti-reflective coating formed thereon by a CVD process or the like, and furthermore, on the coated substrate, an underlayer film may be formed from the resist underlayer film-forming composition of the present invention.

Sometimes, depending on the wavelength of light used in a lithography process, the resist underlayer film formed from the resist underlayer film-forming composition of the present invention absorbs the light. In this case, the resist underlayer film can function as an anti-reflective coating having the effect of preventing light reflected from a substrate. Furthermore, the resist underlayer film formed from the resist underlayer film-forming composition of the present invention can be used as, for example, a layer for preventing the interaction between a substrate and a photoresist; a layer having the function of preventing a material used for a photoresist or a substance produced at the time of exposing a photoresist to light from having an adverse effect on a substrate; a layer having the function of preventing a substance produced from a substrate at the time of heating and baking from diffusing to a photoresist serving as an upper layer; a barrier layer for reducing the effect of poisoning a photoresist layer by a semiconductor substrate dielectric layer; or the like.

In the case where a resist underlayer film formed from the resist underlayer film-forming composition functions as a hard mask, a chromophore suitable for absorption of KrF laser is selected for lithography using the exposure wavelength of KrF (248 nm). A condensed ring structures of, for example, anthracene and phenanthrene and a naphthalimide structure are well known as such chromophores for KrF laser, and these conventional chromophores lead to a larger molecular weight, and therefore cause difficulties in purification by distillation, and hence, the control of metals as impurities in the manufacture of semiconductors was difficult.

The composition of the present invention includes a hydrolyzable silane having a structure in which O (oxygen atom) or S (sulfur atom) is attached to a benzene ring as a chromophore, and this silane absorbs KrF laser, and furthermore, has a low molecular weight, and accordingly can be easily purified by distillation. Therefore, the use of such chromophores allows a hydrolysis-condensation product of a hydrolyzable silane having a low impurity metal content to be used for the above-mentioned resist underlayer film-forming composition, whereby a semiconductor product containing less impurities can be manufactured.

Furthermore, the resist underlayer film formed from the resist underlayer film-forming composition of the present invention can be applied to a substrate having via holes formed therein for use in the dual-damascene process, and can be used as an embedding material to fill up the holes. Furthermore, the resist underlayer film can be used as a flattening material to make the surface of a semiconductor substrate having projections and depressions flat.

Furthermore, the resist underlayer film serving as an underlayer film for EUV resist can be used for the purposes mentioned below, besides as a hard mask. That is, the above-mentioned resist underlayer film-forming composition can be used for an anti-reflective underlayer coating for EUV resist that can prevent exposure light undesirable for EUV exposure (wavelength of 13.5 nm), such as UV and DUV mentioned above (ArF laser, KrF laser), from reflecting from a substrate or an interface, without intermixing with the EUV resist. The resist underlayer film can efficiently prevent the reflection at the underlayer of EUV resist. When used as an underlayer film for EUV resist, the resist underlayer film can be processed in the same manner as for an underlayer film for photoresists.

Furthermore, the present invention relates to a silane of Formula (1').

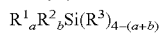

Formula (1')

In Formula (1'), $R^1$ is an organic group of Formula (2'):

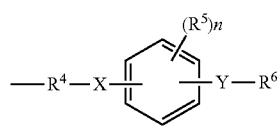

Formula (2')

and bonded to a silicon atom through a Si—C bond. $R^2$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, an amino group, or a cyano group, and is bonded to a silicon atom through a Si—C bond. $R^3$ is an alkoxy group, an acyloxy group, or a halogen group. a is an integer of 1, b is an integer of 0 to 2, and a+b is an integer of 1 to 3.

In Formula (2'), each of X and Y is an oxygen atom or a sulfur atom. However, X and Y are not the same atom at the same time. That is, in the present invention, X is an oxygen atom and Y is a sulfur atom, or, alternatively, X is a sulfur atom and Y is an oxygen atom.

$R^6$ is an optionally substituted $C_{1-10}$ alkyl group, $R^4$ is an optionally substituted $C_{1-10}$ alkylene group, and $R^5$ is an optionally substituted $C_{1-10}$ alkyl group. n is an integer of 0 to 4.

Examples of the alkyl group, the aryl group, the halogenated alkyl group, the halogenated aryl group, the alkoxyaryl group, the alkenyl group, or the organic group having an epoxy group, an acryloyl group, a methacryloyl group, a mercapto group, an amino group, or a cyano group, the alkoxy group, the acyloxy group, and the halogen group, which are defined in Formula (1') and Formula (2') above, include the above-mentioned examples.

EXAMPLES

Synthesis of Compound 1

Into a 300-ml three-neck flask equipped with a magnetic stirrer, 25.0 g of 4-(methylthio)phenol, 7.13 g of sodium hydroxide, 50 g of toluene, and 50 g of N-methylpyrrolidone (hereinafter, also referred to as NMP) were introduced, and allowed to react in an oil bath at 130° C. for 4 hours while water and the toluene were removed. To the solution, 37.94 g of chloromethyltriethoxysilane was added dropwise, and heated and stirred at 130° C. for 4 hours. The obtained solution was cooled to room temperature and transferred to a separating funnel, and 120 g of toluene and 90 g of water were added thereto to wash an organic phase. After the washing was repeated 3 times, magnesium sulfate was added to the organic phase and dried, followed by filtration, and the solvent was removed by evaporation to obtain a crude product. The crude product was then purified by distillation under reduced pressure to obtain 30 g of Compound 1 as a target product.

$^1$H-NMR (500 MHz, DMSO-$d_6$): 1.19 ppm (t, 9H), 2.42 ppm (s, 3H), 3.68 ppm (s, 2H), 3.86 ppm (q, 6H), 6.95 (d, 2H), 7.24 ppm (d, 2H)

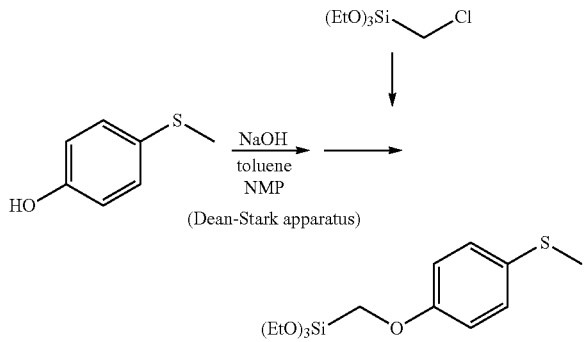

Synthesis of Compound 2

Into a 300-ml three-neck flask equipped with a magnetic stirrer, 25.0 g of 4-(trifluoromethylthio)phenol, 5.15 g of sodium hydroxide, 50 g of toluene, and 50 g of NMP were introduced, and allowed to react in an oil bath at 130° C. for 4 hours while water and the toluene were removed. To the solution, 27.39 g of chloromethyltriethoxysilane was added dropwise, and heated and stirred at 130° C. for 4 hours. The obtained solution was cooled to room temperature and transferred to a separating funnel, and 120 g of toluene and 90 g of water were added thereto to wash an organic phase. After the washing was repeated 3 times, magnesium sulfate was added to the organic phase and dried, followed by filtration, and the solvent was removed by evaporation to obtain a crude product. The crude product was then purified by distillation under reduced pressure to obtain 25 g of Compound 2 as a target product.

¹H-NMR (500 MHz, DMSO-d₆): 1.19 ppm (t, 9H), 3.78 ppm (s, 2H), 3.87 ppm (q, 6H), 7.13 (d, 2H), 7.60 ppm (d, 2H)

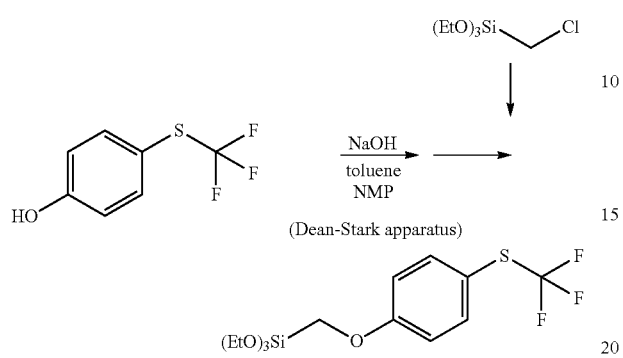

Synthesis of Compound 3

Into a 300-ml three-neck flask equipped with a magnetic stirrer, 25.0 g of 3-methyl-4-(methylthio)phenol, 6.48 g of sodium hydroxide, 50 g of toluene, and 50 g of NMP were introduced, and allowed to react in an oil bath at 130° C. for 4 hours while water and the toluene were removed. To the solution, 34.49 g of chloromethyltriethoxysilane was added dropwise, and heated and stirred at 130° C. for 4 hours. The obtained solution was cooled to room temperature and transferred to a separating funnel, and 120 g of toluene and 90 g of water were added thereto to wash an organic phase. After the washing was repeated 3 times, magnesium sulfate was added to the organic phase and dried, followed by filtration, and the solvent was removed by evaporation to obtain a crude product. The crude product was then purified by distillation under reduced pressure to obtain 35 g of Compound 3 as a target product.

¹H-NMR (500 MHz, DMSO-d₆): 1.20 ppm (t, 9H), 2.29 ppm (s, 3H), 2.37 ppm (s, 3H), 3.67 ppm (s, 2H), 3.86 ppm (q, 6H), 6.84 (d, 1H), 6.89 (d, 1H), 7.18 ppm (d, 1H)

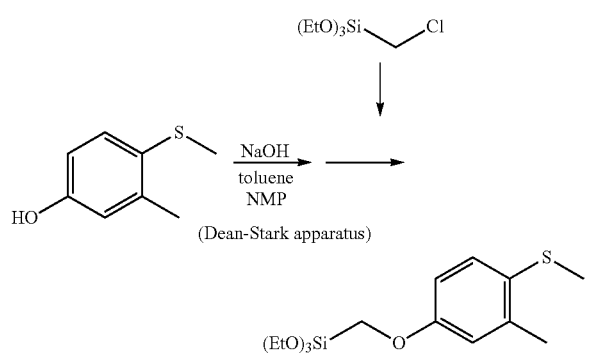

Synthesis of Compound 4

Into a 300-ml three-neck flask equipped with a magnetic stirrer, 25.0 g of 3-methoxybenzenethiol, 7.13 g of sodium hydroxide, 50 g of toluene, and 50 g of NMP were introduced, and allowed to react in an oil bath at 130° C. for 4 hours while water and the toluene were removed. To the solution, 37.94 g of chloromethyltriethoxysilane was added dropwise, and heated and stirred at 130° C. for 4 hours. The obtained solution was cooled to room temperature and transferred to a separating funnel, and 120 g of toluene and 90 g of water were added thereto to wash an organic phase. After the washing was repeated 3 times, magnesium sulfate was added to the organic phase and dried, followed by filtration, and the solvent was removed by evaporation to obtain a crude product. The crude product was then purified by distillation under reduced pressure to obtain 16 g of Compound 4 as a target product.

¹H-NMR (500 MHz, DMSO-d₆): 1.19 ppm (t, 9H), 2.33 ppm (s, 2H), 3.75 ppm (s, 3H), 3.83 ppm (q, 6H), 6.70 (d, 1H), 6.86 (d, 2H), 7.20 ppm (t, 1H)

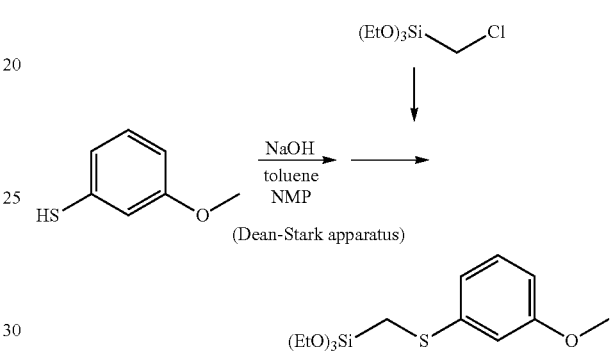

Synthesis of Compound 5

Into a 300-ml three-neck flask equipped with a magnetic stirrer, 25.0 g of 4-methoxybenzenethiol, 7.13 g of sodium hydroxide, 50 g of toluene, and 50 g of NMP were introduced, and allowed to react in an oil bath at 130° C. for 4 hours while water and the toluene were removed. To the solution, 37.94 g of chloromethyltriethoxysilane was added dropwise, and heated and stirred at 130° C. for 4 hours. The obtained solution was cooled to room temperature and transferred to a separating funnel, and 120 g of toluene and 90 g of water were added thereto to wash an organic phase. After the washing was repeated 3 times, magnesium sulfate was added to the organic phase and dried, followed by filtration, and the solvent was removed by evaporation to obtain a crude product. The crude product was then purified by distillation under reduced pressure to obtain 20 g of Compound 5 as a target product.

¹H-NMR (500 MHz, DMSO-d₆): 1.18 ppm (t, 9H), 2.29 ppm (s, 2H), 3.73 ppm (s, 3H), 3.82 ppm (q, 6H), 6.90 (d, 2H), 7.28 ppm (d, 2H)

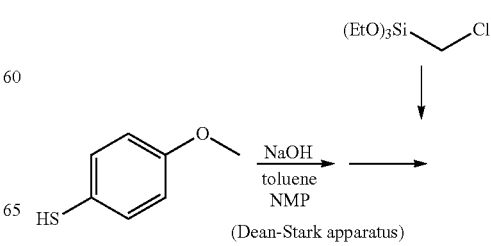

-continued

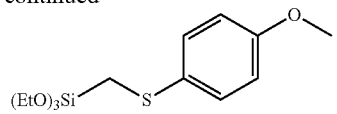

Synthesis of Compound 6

Into a 300-ml three-neck flask equipped with a magnetic stirrer, 25.0 g of 2-(methylthio)phenol, 7.13 g of sodium hydroxide, 50 g of toluene, and 50 g of NMP were introduced, and allowed to react in an oil bath at 130° C. for 4 hours while water and the toluene were removed. To the solution, 37.94 g of chloromethyltriethoxysilane was added dropwise, and heated and stirred at 130° C. for 4 hours. The obtained solution was cooled to room temperature and transferred to a separating funnel, and 120 g of toluene and 90 g of water were added thereto to wash an organic phase. After the washing was repeated 3 times, magnesium sulfate was added to the organic phase and dried, followed by filtration, and the solvent was removed by evaporation to obtain a crude product. The crude product was then purified by distillation under reduced pressure to obtain 20 g of Compound 6 as a target product.

$^1$H-NMR (500 MHz, DMSO-d$_6$): 1.18 ppm (t, 9H), 2.37 ppm (s, 3H), 3.73 ppm (s, 2H), 3.88 ppm (q, 6H), 6.95 (t, 1H), 7.02-7.18 ppm (m, 3H)

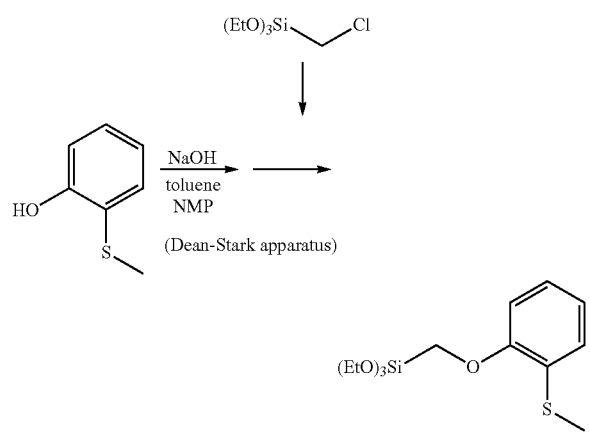

Synthesis of Comparative Compound 1

Into a 300-ml three-neck flask equipped with a magnetic stirrer, 25.0 g of 4-methoxy phenol, 8.05 g of sodium hydroxide, 50 g of toluene, and 50 g of NMP were introduced, and allowed to react in an oil bath at 130° C. for 4 hours while water and the toluene were removed. To the solution, 42.84 g of chloromethyltriethoxysilane was added dropwise, and heated and stirred at 130° C. for 4 hours. The obtained solution was cooled to room temperature and transferred to a separating funnel, and 120 g of toluene and 90 g of water were added thereto to wash an organic phase. After the washing was repeated 3 times, magnesium sulfate was added to the organic phase and dried, followed by filtration, and the solvent was removed by evaporation to obtain a crude product. The crude product was then purified by distillation under reduced pressure to obtain 25 g of Comparative Compound 1 as a target product.

$^1$H-NMR (500 MHz, DMSO-d$_6$): 1.19 ppm (t, 9H), 3.63 ppm (s, 2H), 3.70 ppm (s, 3H), 3.86 ppm (q, 6H), 6.85 (d, 2H), 6.91 ppm (d, 2H)

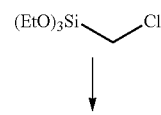

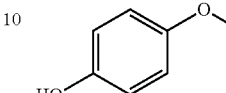

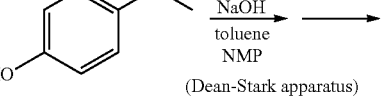

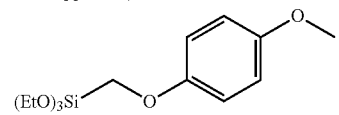

Synthesis Example 1

5.24 g (10% by mole of the whole of the silane) of Compound 1, 25.86 g (75% by mole of the whole of the silane) of tetraethoxysilane, 4.43 g (15% by mole of the whole of the silane) of methyltriethoxysilane, and 53.29 g of acetone were introduced into a 300-ml flask, and, while the mixed solution was stirred with a magnetic stirrer, 11.19 g of 0.01 mol/l hydrochloric acid was added dropwise to the mixed solution. After the addition, the flask is transferred to an oil bath adjusted to 85° C., and under warming-reflux, the solution was allowed to react for 240 minutes. The reaction solution was then cooled to room temperature. To the reaction solution, 72.00 g of propylene glycol monomethyl ether acetate was added, and then, ethanol as a reaction by-product, water, hydrochloric acid, and acetone were removed therefrom by distillation under reduced pressure, and the resultant solution was concentrated to obtain a hydrolysis-condensation product (polymer) propylene glycol monomethyl ether acetate solution. The solution was adjusted so as to contain solid residues in a proportion of 30% by weight at 140° C. The obtained polymer corresponds to Formula (3-1), and the weight-average molecular weight measured by GPC in terms of polystyrene was Mw 1,500. This polymer is referred to as P1.

Synthesis Examples 2 to 10 and Comparative Synthesis Examples 1 to 2 were carried out in the same manner as in Synthesis Example 1. Table 1 shows each component and the usage amount thereof.

A polymer obtained in Synthesis Example 2 corresponds to Formula (3-2), and had a weight-average molecular weight of 1,800. This polymer is referred to as P2. A polymer obtained in Synthesis Example 3 corresponds to Formula (3-3), and had a weight-average molecular weight of 1,800. This polymer is referred to as P3. A polymer obtained in Synthesis Example 4 corresponds to Formula (3-4), and had a weight-average molecular weight of 1,600. This polymer is referred to as P4. A polymer obtained in Synthesis Example 5 corresponds to Formula (3-5), and had a weight-average molecular weight of 1,700. This polymer is referred to as P5. A polymer obtained in Synthesis Example 6 corresponds to Formula (3-6), and had a weight-average molecular weight of 1,700. This polymer is referred to as P6. A polymer obtained in Synthesis Example 7 corresponds to Formula (3-7), and had a weight-average molecular weight of 1,700. This polymer is referred to as P7. A polymer obtained in Synthesis Example 8 corresponds to Formula (3-8), and had a weight-average molecular weight of 1,700. This polymer is referred to as P8. A polymer obtained in Synthesis Example 9 corresponds to Formula (3-9), and had a weight-average molecular weight of 2,000. This polymer is referred to as P9. A polymer obtained in Synthesis Example 10 corresponds to Formula (3-9), and had a weight-average molecular weight of 1,600. This polymer is referred to as P10.

A polymer obtained in Comparative Synthesis Example 1 corresponds to Formula (4-1), and had a weight-average molecular weight of 1,700. This polymer is referred to as RP1.

Formula (4-1)

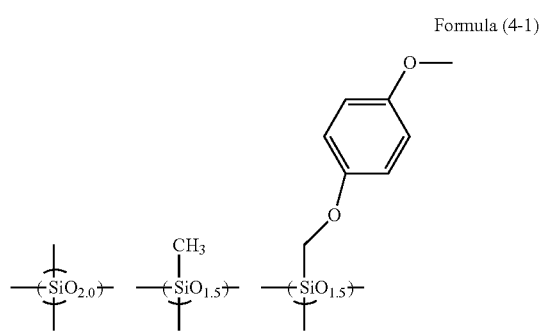

A polymer obtained in Comparative Synthesis Example 2 corresponds to Formula (3-6), and had a weight-average molecular weight of 1,600. This polymer is referred to as RP2.

In Table 1, TEOS is tetraethoxysilane, MTEOS is methyltriethoxysilane, MeOPSP is 3-(4-methoxyphenylsulfonyl)propyltriethoxysilane, and MeOBSA is 4-methoxy-N-(3-(triethoxysilyl)propyl)benzenesulfonamide. Acid denotes an HCl aqueous solution having a concentration of 0.01 M.

TABLE 1

| | | | | | |
|---|---|---|---|---|---|
| Synthesis Example 1 | Compound 1 5.24 g | TEOS 25.86 g | MTEOS 4.43 g | Acid 11.19 g | Solvent (acetone) 53.29 g |
| Synthesis Example 2 | Compound 2 6.00 g | TEOS 25.30 g | MTEOS 4.33 g | Acid 10.94 g | Solvent (acetone) 53.44 g |
| Synthesis Example 3 | Compound 3 5.24 g | TEOS 25.86 g | MTEOS 4.43 g | Acid 11.19 g | Solvent (acetone) 53.29 g |
| Synthesis Example 4 | Compound 4 5.44 g | TEOS 25.71 g | MTEOS 4.40 g | Acid 11.12 g | Solvent (acetone) 53.33 g |
| Synthesis Example 5 | Compound 5 5.24 g | TEOS 25.86 g | MTEOS 4.43 g | Acid 11.19 g | Solvent (acetone) 53.33 g |
| Synthesis Example 6 | Compound 6 5.24 g | TEOS 25.86 g | MTEOS 4.43 g | Acid 11.19 g | Solvent (acetone) 53.33 g |
| Synthesis Example 7 | Compound 1 5.20 g | TEOS 25.65 g | MTEOS 4.10 g MeOPSP 0.62 g | Acid 11.10 g | Solvent (acetone) 53.34 g |
| Synthesis Example 8 | Compound 1 5.22 g | TEOS 25.75 g | MTEOS 4.26 g MeOBSA 0.32 g | Acid 11.14 g | Solvent (acetone) 53.32 g |
| Synthesis Example 9 | Compound 1 14.20 g | TEOS 21.81 g | — | Acid 9.97 g | Solvent (acetone) 54.02 g |
| Synthesis Example 10 | Compound 1 22.00 g | TEOS 14.49 g | — | Acid 8.77 g | Solvent (acetone) 54.74 g |
| Comparative Synthesis Example 1 | Comparative Compound 1 5.00 g | TEOS 26.03 g | MTEOS 4.46 g | Acid 11.26 g | Solvent (acetone) 53.24 g |
| Comparative Synthesis Example 2 | Compound 6 2.43 g | TEOS 26.70 g | MTEOS 6.25 g | Acid 11.55 g | Solvent (acetone) 53.07 g |

(Preparation of Resist Underlayer Film-Forming Composition)

Each of the silicon-containing polymers obtained in Synthesis Examples 1 to 10 and Comparative Synthesis Examples 1 and 2 above was mixed with an acid, a curing catalyst, an additive, a solvent, and water so as to achieve the corresponding one of ratios shown in Table 2, and each of the mixtures was filtered with a 0.02-μm fluororesin filter to prepare a solution of a resist underlayer film-forming composition. The ratios of the polymers in Table 2 each refer not to the masses of the respective polymer solutions, but to the mass of the polymers themselves.

In Table 2, MA is maleic acid, Curing Catalyst C1 is N-(3-triethoxysilylpropyl)-4,5-dihydroimidazole (abbreviated as IMIDTEOS), Curing Catalyst C2 is benzyltriethylammonium chloride (abbreviated as BTEAC), Curing Catalyst C3 is triphenylsulfonium maleate (abbreviated as TPSMA), Curing Catalyst C4 is triphenylsulfonium nitrate (abbreviated as TPSNO3), Additive A1 is triphenylsulfonium trifluoromethanesulfonate (abbreviated as TPS105), Additive A2 is R-40LM (manufactured by DIC Corporation, having a fluorine-based surfactant as an ingredient), Solvent S1 is propylene glycol monomethyl ether (abbreviated as PGME), Solvent S2 is propylene glycol monoethyl ether (abbreviated as PGEE), and Solvent S3 is propylene glycol monomethyl ether acetate (abbreviated as PGMEA). Ultrapure water is used as water. Each of the addition amounts is expressed using part by mass.

TABLE 2

| | Polymer | Acid | Curing catalyst | Additive | Solvent | | | Water |
|---|---|---|---|---|---|---|---|---|
| Example 1 (part by mass) | P1 4 | MA 0.04 | C1 0.024 | | S1 5 | S2 73 | S3 10 | water 12 |
| Example 2 (part by mass) | P2 4 | MA 0.04 | C1 0.024 | | S1 5 | S2 73 | S3 10 | water 12 |
| Example 3 (part by mass) | P3 4 | MA 0.04 | C1 0.024 | | S1 5 | S2 73 | S3 10 | water 12 |
| Example 4 (part by mass) | P4 4 | MA 0.04 | C1 0.024 | | S1 5 | S2 73 | S3 10 | water 12 |
| Example 5 (part by mass) | P5 4 | MA 0.04 | C1 0.024 | | S1 5 | S2 73 | S3 10 | water 12 |
| Example 6 (part by mass) | P6 4 | MA 0.04 | C1 0.024 | | S1 5 | S2 73 | S3 10 | water 12 |

TABLE 2-continued

| | Polymer | Acid | Curing catalyst | Additive | Solvent | | | Water |
|---|---|---|---|---|---|---|---|---|
| Example 7 | P1 | MA | C2 | | S1 | S2 | S3 | water |
| (part by mass) | 4 | 0.04 | 0.024 | | 5 | 73 | 10 | 12 |
| Example 8 | P1 | MA | C2 | A1 | S1 | S2 | S3 | water |
| (part by mass) | 4 | 0.04 | 0.024 | 0.04 | 5 | 73 | 10 | 12 |
| Example 9 | P1 | MA | C3 | A2 | S1 | S2 | S3 | water |
| (part by mass) | 4 | 0.04 | 0.04 | 0.04 | 5 | 73 | 10 | 12 |
| Example 10 | P1 | MA | C4 | A2 | S1 | S2 | S3 | water |
| (part by mass) | 4 | 0.04 | 0.04 | 0.04 | 5 | 73 | 10 | 12 |
| Example 11 | P7 | MA | C1 | A2 | S1 | S2 | S3 | water |
| (part by mass) | 4 | 0.04 | 0.024 | 0.04 | 5 | 73 | 10 | 12 |
| Example 12 | P8 | MA | C1 | A2 | S1 | S2 | S3 | water |
| (part by mass) | 4 | 0.04 | 0.024 | 0.04 | 5 | 73 | 10 | 12 |
| Example 13 | P9 | MA | C2 | | S1 | S2 | S3 | water |
| (part by mass) | 4 | 0.04 | 0.024 | | 5 | 73 | 10 | 12 |
| Example 14 | P10 | MA | C2 | | S1 | S2 | S3 | water |
| (part by mass) | 4 | 0.04 | 0.024 | | 5 | 73 | 10 | 12 |
| Comparative Example 1 | RP1 | MA | C1 | | S1 | S2 | S3 | water |
| (part by mass) | 4 | 0.04 | 0.024 | | 5 | 73 | 10 | 12 |
| Comparative Example 2 | RP2 | MA | C1 | | S1 | S2 | S3 | water |
| (part by mass) | 4 | 0.04 | 0.024 | | 5 | 73 | 10 | 12 |

(Preparation of Organic Underlayer Film (Layer A) Forming Composition)

Under an atmosphere of nitrogen, carbazole (6.69 g, 0.040 mol, manufactured by Tokyo Chemical Industry Co., Ltd.), 9-fluorenone (7.28 g, 0.040 mol, manufactured by Tokyo Chemical Industry Co., Ltd.), and p-toluenesulfonic acid monohydrate (0.76 g, 0.0040 mol, manufactured by Tokyo Chemical Industry Co., Ltd.) were introduced into a 100-ml four-neck flask, and 1,4-dioxane (6.69 g, manufactured by KANTO CHEMICAL CO., INC.) was charged therein and stirred. The resultant mixture was dissolved with the temperature increased to 100° C. to initiate polymerization. After 24 hours, the product was left cool to 60° C., and then, chloroform (34 g, manufactured by KANTO CHEMICAL CO., INC.) was added to dilute the product, and the resultant product was reprecipitated in methanol (168 g, manufactured by KANTO CHEMICAL CO., INC.). The obtained precipitate was filtered and dried with a vacuum drier at 80° C. for 24 hours, yielding in 9.37 g of a polymer (Formula (E-1), hereinafter abbreviated as PCzFL) as a target product.

Formula (E-1)

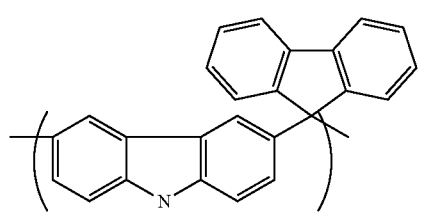

The measurement results of $^1$H-NMR of PCzFL were as follows.

$^1$H-NMR (400 MHz, DMSO-$d_6$): δ7.03-7.55 (br, 12H), δ7.61-8.10 (br, 4H), δ11.18 (br, 1H)

The weight average molecular weight Mw of PCzFL measured by GPC in terms of polystyrene was 2,800, and the degree of poly-distribution Mw/Mn was 1.77.

20 g of the obtained resin was mixed with 3.0 g of tetramethoxymethyl glycoluril (the trade name Powderlink 1174, manufactured by Mitsui Cytec Ltd.) as a crosslinking agent, 0.30 g of pyridinium p-toluenesulfonate as a catalyst, and 0.06 g of MEGAFAC R-40LM (the trade name, manufactured by DIC Corporation) as a surfactant. The mixture was dissolved in 88 g of propylene glycol monomethyl ether acetate to form a solution. The solution was then filtered with a polyethylene microfilter having a pore size of 0.10 μm, and further filtered with a polyethylene microfilter having a pore size of 0.05 μm to prepare a solution of an organic underlayer film (Layer A) forming composition used for a lithography process using a multilayer film.

(Optical Constant Measurement)

Each of the Si-containing resist underlayer film-forming compositions prepared in Examples 1 to 14 and Comparative Examples 1 and 2 was applied onto a silicon wafer by a spinner. The coated silicon wafers each were heated on a hot plate at 215° C. for 1 minute to form the respective Si-containing resist underlayer films (with a film thickness of 0.05 μm). Then, the refractive indexes (n value) and the optical absorption coefficients (also referred to as k value or attenuation coefficient) at wavelengths of 193 nm and 248 nm of these resist underlayer films were measured using a spectroscopic ellipsometer (VUV-VASEVU-302, manufactured by J.A. Woollam Co.). Table 3 shows the results.

TABLE 3

Refractive index n and optical absorption coefficient k at wavelengths of 193 nm and 248 nm

| | n/k (measured at 193 nm) | n/k (measured at 248 nm) |
|---|---|---|
| Example 1 | 1.55/0.19 | 1.55/0.07 |
| Example 2 | 1.50/0.18 | 1.57/0.07 |
| Example 3 | 1.51/0.15 | 1.57/0.07 |
| Example 4 | 1.56/0.11 | 1.56/0.05 |
| Example 5 | 1.55/0.18 | 1.55/0.06 |
| Example 6 | 1.55/0.18 | 1.55/0.05 |
| Example 7 | 1.55/0.19 | 1.55/0.07 |
| Example 8 | 1.55/0.20 | 1.55/0.08 |
| Example 9 | 1.55/0.20 | 1.55/0.08 |
| Example 10 | 1.55/0.20 | 1.55/0.08 |
| Example 11 | 1.57/0.21 | 1.56/0.08 |
| Example 12 | 1.55/0.19 | 1.55/0.07 |
| Example 13 | 1.61/0.40 | 1.64/0.14 |
| Example 14 | 1.64/0.49 | 1.68/0.17 |
| Comparative Example 1 | 1.58/0.23 | 1.55/0.00 |
| Comparative Example 2 | 1.54/0.10 | 1.55/0.02 |

(Measurement of Dry Etching Rate)

For the measurement of dry etching rate, the following etcher and etching gas were used.

ES401 (manufactured by NIPPON SCIENTIFIC Co., Ltd.): $CF_4$

RIE-10NR (manufactured by SAMCO INC.): $O_2$

The solutions of the Si-containing resist underlayer film-forming compositions prepared in Examples 1 to 14 and Comparative Examples 1 and 2 were each applied onto a silicon wafer by a spinner. The coated silicon wafer was heated on a hot plate at 215° C. for 1 minute to form a Si-containing resist underlayer film (Layer B). Furthermore, likewise, the organic underlayer film (Layer A) forming composition was applied to the silicon wafer by a spinner to form an organic underlayer film (Layer A) (with a film thickness of 0.20 μm) on the wafer. Using $O_2$ gas as an etching gas, the dry etching rates were measured, and comparisons between the dry etching rate of the organic underlayer film (Layer A) and the respective dry etching rates of the Si-containing resist underlayer films of Examples 1 to 14 and Comparative Examples 1 and 2 were performed. The resistance to the oxygen-based gas ($O_2$ gas) was expressed by the etching rate ratio of [Si-containing resist underlayer film (Layer B)]/[organic underlayer film (Layer A)] (Table 4).

Furthermore, the solutions of the Si-containing resist underlayer film-forming composition prepared in Examples 1 to 14 and Comparative Examples 1 and 2 were each applied onto a silicon wafer by a spinner. The coated silicon wafer was heated on a hot plate at 215° C. for 1 minute to form a Si-containing resist underlayer film (Layer B). Furthermore, likewise, the organic underlayer film (Layer A) forming composition was applied to the silicon wafer by a spinner to form an organic underlayer film (Layer A) (with a film thickness of 0.20 μm) on the wafer. Then, using a fluorine-based gas ($CF_4$ gas), the dry etching rates (etching rate: nm/min) were measured. In the same manner as the above, the resistance to the fluorine-based gas ($CF_4$ gas) was expressed by the etching rate ratio of [Si-containing resist underlayer film (Layer B)]/[organic underlayer film (Layer A)] (Table 4).

[Evaluation of Pattern Shape]

The organic underlayer film (Layer A) forming composition was applied onto a silicon wafer, followed by baking on a hot plate at 240° C. for 60 seconds to obtain an organic underlayer film (Layer A) with a film thickness of 200 nm. On the organic underlayer film, each of the Si-containing resist underlayer film-forming compositions prepared by Examples 1 to 14 and Comparative Examples 1 and 2 was applied by a spinner. The coated silicon wafer was then baked on a hot plate at 215° C. for 1 minute to form a resist underlayer film (with a film thickness of 0.06 μm). Onto this resist underlayer film, a commercially available photoresist solution (trade name: TDUR-P3435LP, manufactured by TOKYO OHKA KOGYO CO., LTD.) was applied by a spinner, and heated on a hot plate at 90° C. for 1 minute to form a photoresist film (with a film thickness of 0.25 μm). Next, using NSR-S205C, a lens scanning stepper manufactured by NIKON CORPORATION, (with a wavelength of 248 nm, NA: 0.75, σ: 0.85 (CONVENTIONAL)), the photoresist film was exposed to light through a mask set so that the line width of a photoresist pattern and the intervals between lines of the pattern were 0.16 μm after development. Subsequently, "post-exposure heating" was carried out on a hot plate at 110° C. for 1 minute. After cooled, the photoresist film was developed using a 2.38% tetramethyl-ammonium hydroxide solution as a developing solution. The shape of the resist after the development was evaluated (Table 4).

TABLE 4

| | $CF_4$ | $O_2$ | Resist shape |
|---|---|---|---|
| Example 1 | 24.0 | 0.03 | straight |
| Example 2 | 25.0 | 0.04 | straight |
| Example 3 | 24.0 | 0.03 | straight |
| Example 4 | 24.0 | 0.03 | straight |
| Example 5 | 24.0 | 0.03 | straight |
| Example 6 | 24.0 | 0.03 | straight |
| Example 7 | 24.0 | 0.03 | straight |
| Example 8 | 24.0 | 0.03 | straight |
| Example 9 | 24.0 | 0.03 | straight |
| Example 10 | 24.0 | 0.03 | straight |
| Example 11 | 23.5 | 0.03 | straight |
| Example 12 | 24.0 | 0.03 | straight |
| Example 13 | 25.5 | 0.04 | straight |
| Example 14 | 26.0 | 0.06 | straight |
| Comparative Example 1 | 23.5 | 0.03 | multiple light exposure shape due to standing wave |
| Comparative Example 2 | 24.0 | 0.02 | multiple light exposure shape due to standing wave |

INDUSTRIAL APPLICABILITY

The resist underlayer film-forming composition of the present invention includes a hydrolyzable silane having a structure in which O (oxygen atom) or S (sulfur atom) is attached to a benzene ring as a chromophore. This silane can absorb KrF laser and, furthermore, has a low molecular weight, thereby being capable of easy purification by distillation. Therefore, a semiconductor product containing less impurities can be manufactured from the above-mentioned resist underlayer film-forming composition including a hydrolysis-condensation product of a hydrolyzable silane including such chromophores and having a low impurity metal content.

The invention claimed is:

1. A silane of Formula (1″):

$R^1{}_a R^2{}_b Si(R^3)_{4-(a+b)}$            Formula (1″)

wherein $R^1$ is bonded to the silicon atom through a Si—C bond is an organic group of Formula (2″):

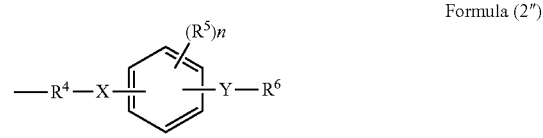

Formula (2″)

wherein

X is an oxygen atom and Y is a sulfonamide group;

$R^6$ is an optionally substituted $C_{1-10}$ alkyl group;

$R^4$ is an optionally substituted $C_{1-10}$ alkylene group;

$R^5$ is an optionally substituted $C_{1-10}$ alkyl group; and n is an integer of 0 to 4;

$R^2$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, an amino group, or a cyano group, and is bonded to a silicon atom through a Si—C bond;

$R^3$ is an alkoxy group, an acyloxy group, or a halogen group;

a is an integer of 1;
b is an integer of 0 to 2; and
a+b is an integer of 1 to 3.

2. A silane of Formula (1'):

$$R^1_a R^2_b Si(R^3)_{4-(a+b)} \quad \text{Formula (1')}$$

wherein $R^1$ is bonded to the silicon atom through a Si—C bond and is an organic group of Formula (2'):

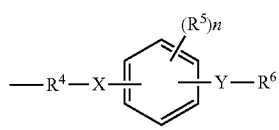

Formula (2')

wherein each of X and Y is an oxygen atom or a sulfur atom, provided that X and Y are not the same atom at the same time;

$R^6$ is an optionally substituted $C_{1-10}$ alkyl group;
$R^4$ is an optionally substituted $C_{1-10}$ alkylene group;
$R^5$ is an optionally substituted $C_{1-10}$ alkyl group; and
n is an integer of 0 to 4;
$R^2$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, an amino group, or a cyano group, and is bonded to a silicon atom through a Si—C bond;
$R^3$ is an alkoxy group, an acyloxy group, or a halogen group;
a is an integer of 1;
b is an integer of 0 to 2; and
a+b is an integer of 1 to 3
wherein the silane of Formula (1') is a silane selected from the group consisting of Formula (1-1), Formula (1-2), Formula (1-3), Formula (1-4), Formula (1-6), Formula (1-8), Formula (1-9), Formula (1-10), Formula (1-11), Formula (1-12), Formula (1-13), Formula (1-14), Formula (1-15), Formula (1-16), Formula (1-17), Formula (1-18), Formula (1-19), Formula (1-20), Formula (1-21), Formula (1-22), Formula (1-23), Formula (1-24), Formula (1-25), Formula (1-26), Formula (1-27), Formula (1-28), Formula (1-29), and Formula (1-30), wherein the formulas are:

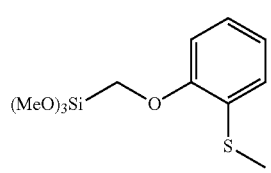

Formula (1-1)

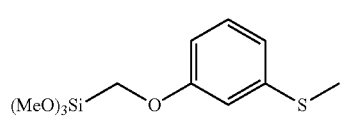

Formula (1-2)

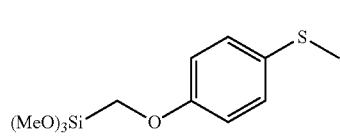

Formula (1-3)

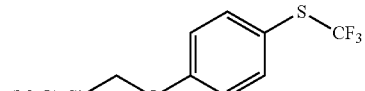

Formula (1-4)

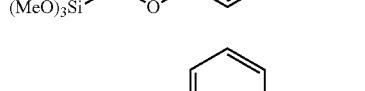

Formula (1-6)

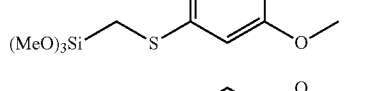

Formula (1-8)

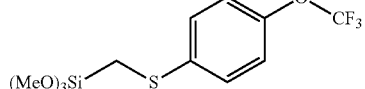

Formula (1-9)

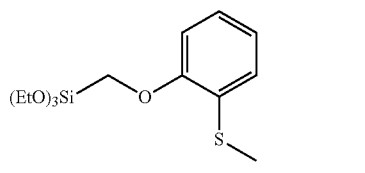

Formula (1-10)

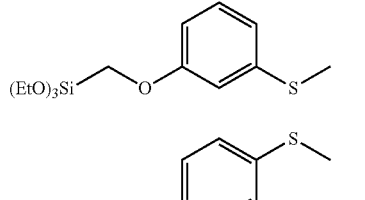

Formula (1-11)

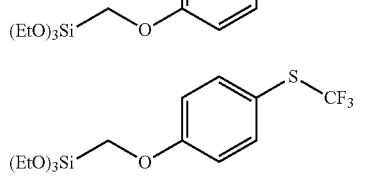

Formula (1-12)

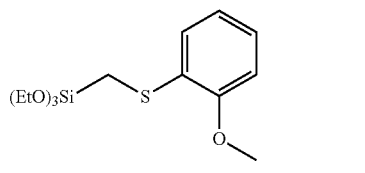

Formula (1-13)

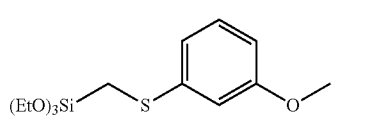

Formula (1-14)

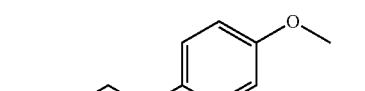

Formula (1-15)

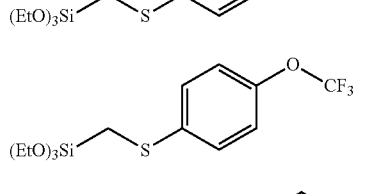

Formula (1-16)

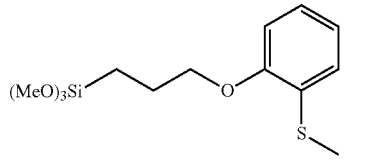

Formula (1-17)

Formula (1-18)
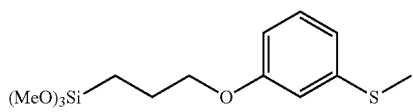

Formula (1-19)
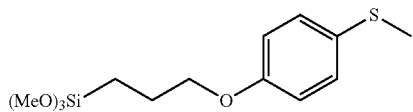

Formula (1-20)
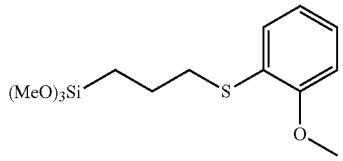

Formula (1-21)
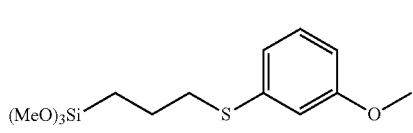

Formula (1-22)
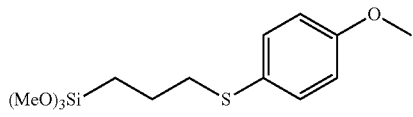

Formula (1-23)
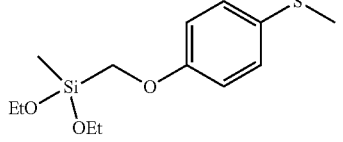

Formula (1-24)
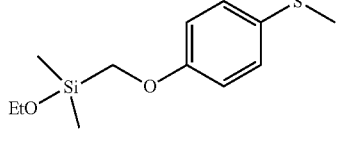

Formula (1-25)
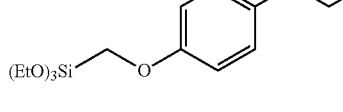

Formula (1-26)
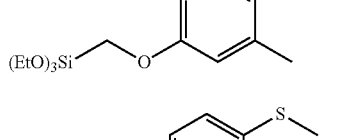

Formula (1-27)
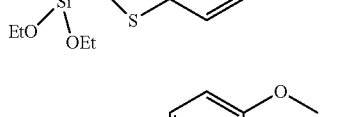

Formula (1-28)
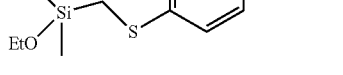

Formula (1-29)
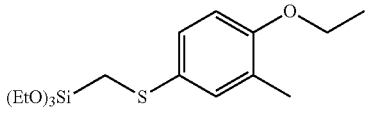

Formula (1-30)
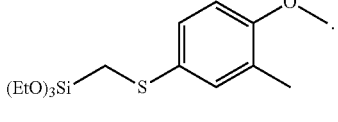

3. The silane according to claim 2, wherein the silane of Formula (1′) is a silane selected from the group consisting of Formula (1-1), Formula (1-2), Formula (1-3), Formula (1-4), Formula (1-8), Formula (1-9), Formula (1-10), Formula (1-11), Formula (1-12), Formula (1-16), Formula (1-17), Formula (1-18), Formula (1-19), Formula (1-20), Formula (1-21), Formula (1-22), Formula (1-23), Formula (1-24), Formula (1-25), Formula (1-26), Formula (1-27), Formula (1-28), Formula (1-29), and Formula (1-30), wherein the formulas are:

Formula (1-1)
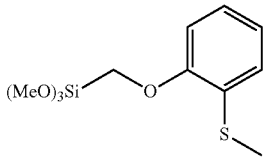

Formula (1-2)

Formula (1-3)
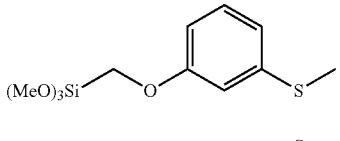

Formula (1-4)

Formula (1-8)
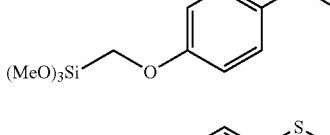

Formula (1-9)

Formula (1-10)
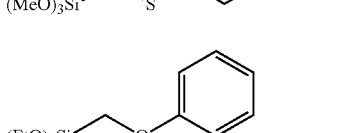
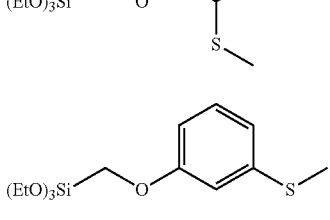

Formula (1-11)
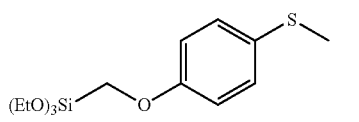

Formula (1-12)
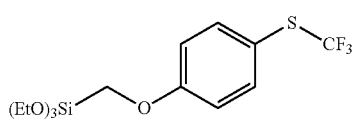

Formula (1-16)
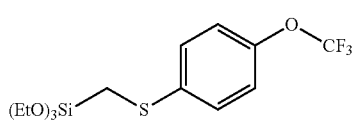

Formula (1-17)
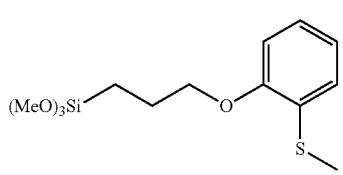

Formula (1-18)
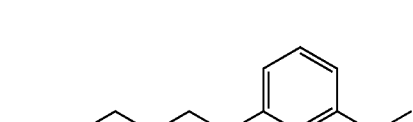

Formula (1-19)

Formula (1-20)
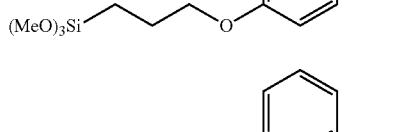

Formula (1-21)
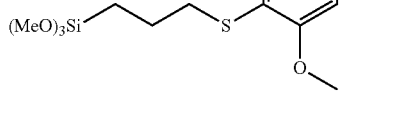

Formula (1-22)
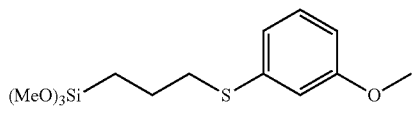

Formula (1-23)
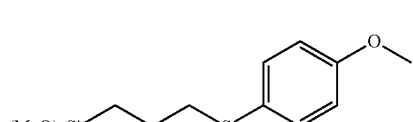

Formula (1-24)
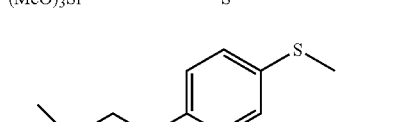

Formula (1-25)
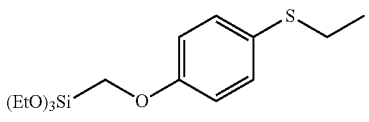

Formula (1-26)
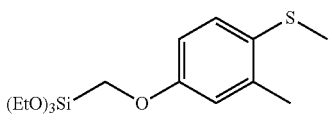

Formula (1-27)
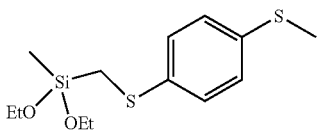

Formula (1-28)
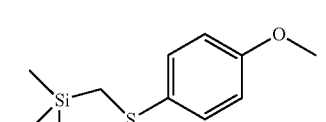

Formula (1-29)
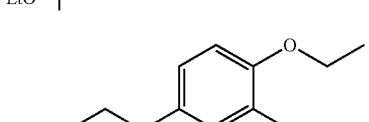

Formula (1-30)
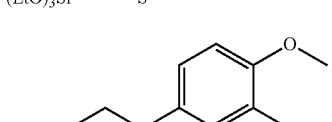

4. The silane according to claim 2, wherein the silane of Formula (1') is a silane selected from the group consisting of Formula (1-26), Formula (1-1), Formula (1-11), and Formula (1-12).

5. A resist underlayer film-forming composition for lithography, the composition comprising the silane of claim 2.

6. A method for manufacturing a semiconductor device, the method comprising:
  applying the resist underlayer film-forming composition as claimed in claim 5 onto a semiconductor substrate, and baking the applied resist underlayer film-forming composition to form a resist underlayer film;
  applying a resist composition onto the underlayer film to form a resist film;
  exposing the resist film to light;
  developing the resist after the exposure to obtain a resist pattern;
  etching the resist underlayer film with the resist pattern; and
  processing the semiconductor substrate with the patterned resist underlayer film.

7. A method for manufacturing a semiconductor device, the method comprising:
  forming an organic underlayer film on a semiconductor substrate;
  applying the resist underlayer film-forming composition as claimed in claim 5 onto the organic underlayer film, and baking the applied resist underlayer film-forming composition to form a resist underlayer film;
  applying a resist composition onto the resist underlayer film to form a resist film;
  exposing the resist film to light;

developing the resist after the exposure to obtain a resist pattern;
etching the resist underlayer film with the resist pattern;
etching the organic underlayer film with the patterned resist underlayer film; and
processing the semiconductor substrate with the patterned organic underlayer film.

8. A silane of Formula (1"):

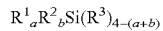
$$R^1{}_a R^2{}_b Si(R^3)_{4-(a+b)} \quad \text{Formula (1")}$$

wherein $R^1$ is bonded to the silicon atom through a Si—C bond is an organic group of Formula (2"):

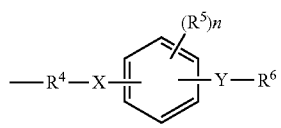

Formula (2")

wherein one of X and Y is an oxygen atom and the other of X and Y is a sulfonamide group;

$R^6$ is an optionally substituted $C_{1-10}$ alkyl group;

$R^4$ is an optionally substituted $C_{1-10}$ alkylene group;

$R^5$ is an optionally substituted $C_{1-10}$ alkyl group; and n is an integer of 1 to 4;

$R^2$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, an amino group, or a cyano group, and is bonded to a silicon atom through a Si—C bond;

$R^3$ is an alkoxy group, an acyloxy group, or a halogen group;

a is an integer of 1;

b is an integer of 0 to 2; and a+b is an integer of 1 to 3.

* * * * *